United States Patent
Hinedi et al.

(10) Patent No.: US 6,263,466 B1
(45) Date of Patent: Jul. 17, 2001

(54) SYSTEM AND METHOD OF SEPARATELY CODING THE HEADER AND PAYLOAD OF A DATA PACKET FOR USE IN SATELLITE DATA COMMUNICATION

(75) Inventors: Sami M. Hinedi, Bellevue; Karl R. Griep, Seattle; Samson Million, Kirkland, all of WA (US)

(73) Assignee: Teledesic LLC, Kirkland, WA (US)

( * ) Notice: Subject to any disclaimer, the term of this patent is extended or adjusted under 35 U.S.C. 154(b) by 0 days.

(21) Appl. No.: 09/035,645

(22) Filed: Mar. 5, 1998

(51) Int. Cl.[7] .................................................. H03M 13/00
(52) U.S. Cl. ........................................ 714/755; 370/389
(58) Field of Search ...................... 714/755; 342/357.16, 342/354; 244/158 R; 375/330, 341, 220; 370/349, 476, 389

(56) References Cited

U.S. PATENT DOCUMENTS

| | | | |
|---|---|---|---|
| 5,041,833 | * 8/1991 | Weinberg | 342/357.16 |
| 5,117,427 | 5/1992 | Miyake et al. . | |
| 5,386,953 | * 2/1995 | Stuart | 244/158 R |
| 5,408,237 | * 4/1995 | Patterson et al. | 342/354 |
| 5,446,747 | 8/1995 | Berrou . | |
| 5,473,601 | 12/1995 | Rosen et al. . | |
| 5,600,629 | * 2/1997 | Daele et al. | 370/349 |
| 5,600,653 | 2/1997 | Chitre et al. . | |
| 5,706,313 | * 1/1998 | Blasiak et al. | 375/330 |
| 5,734,962 | 3/1998 | Hladik et al. . | |
| 5,736,959 | * 4/1998 | Patterson et al. | 342/354 |
| 5,754,600 | * 5/1998 | Rahnema | 375/341 |
| 5,778,139 | 7/1998 | Kim . | |
| 5,796,715 | * 8/1998 | Patterson et al. | 370/349 |
| 5,802,063 | * 9/1998 | Deiss | 370/476 |
| 6,049,566 | * 4/2000 | Saunders et al. | 375/220 |

FOREIGN PATENT DOCUMENTS 0 650 271 A2    4/1995   (EP) .
0 782 291 A2    7/1997   (EP) .

OTHER PUBLICATIONS

Lunsford, J., et al., "Link Enhancement for ATM Over Satellite Links," *Proceedings of the Tenth International Conference on Digital Satellite Communications*, Brighton, UK, May 1995, pp. 129–136.

* cited by examiner

Primary Examiner—Albert Decady
Assistant Examiner—David Ton
(74) Attorney, Agent, or Firm—Christensen O'Connor; Johnson Kindness PLLC

(57) ABSTRACT

A data communication system for a constellation of satellites (13a, 13b, ... ) that employ Earth-fixed cellular beam management technology is disclosed. The data to be communicated is formed into data packets by a transmitting ground terminal (60). Each data packet includes a header (41) with control information and a payload (43) of data to be communicated. The information contained in the header is used to route the data packets through the satellite constellation to the appropriate intended satellite or to a downlink satellite (104). The header and payload databits are outer forward error correction (FEC) encoded (64, 70), optionally interleaved separately (66, 72), and inner error correction encoded by inner FEC encoders (68, 74). After receipt by an uplink satellite (62), processing of the header is accomplished to recover the header of the original signal. That information may then be used to identify and separate the payload into payload intended for the receiving satellite and payload not intended for the receiving satellite. If receiving satellite payload codewords are identified, the corresponding data is processed and used by the satellite. In one embodiment, a hard decision (102) is applied to the payload data packets that are not intended for use by the receiving satellite. In another embodiment, a hard decision is applied to all payload data. The information contained in the header is then used to route the data packets through the satellite constellation to the appropriate intended satellite or to a downlink satellite (104).

74 Claims, 9 Drawing Sheets

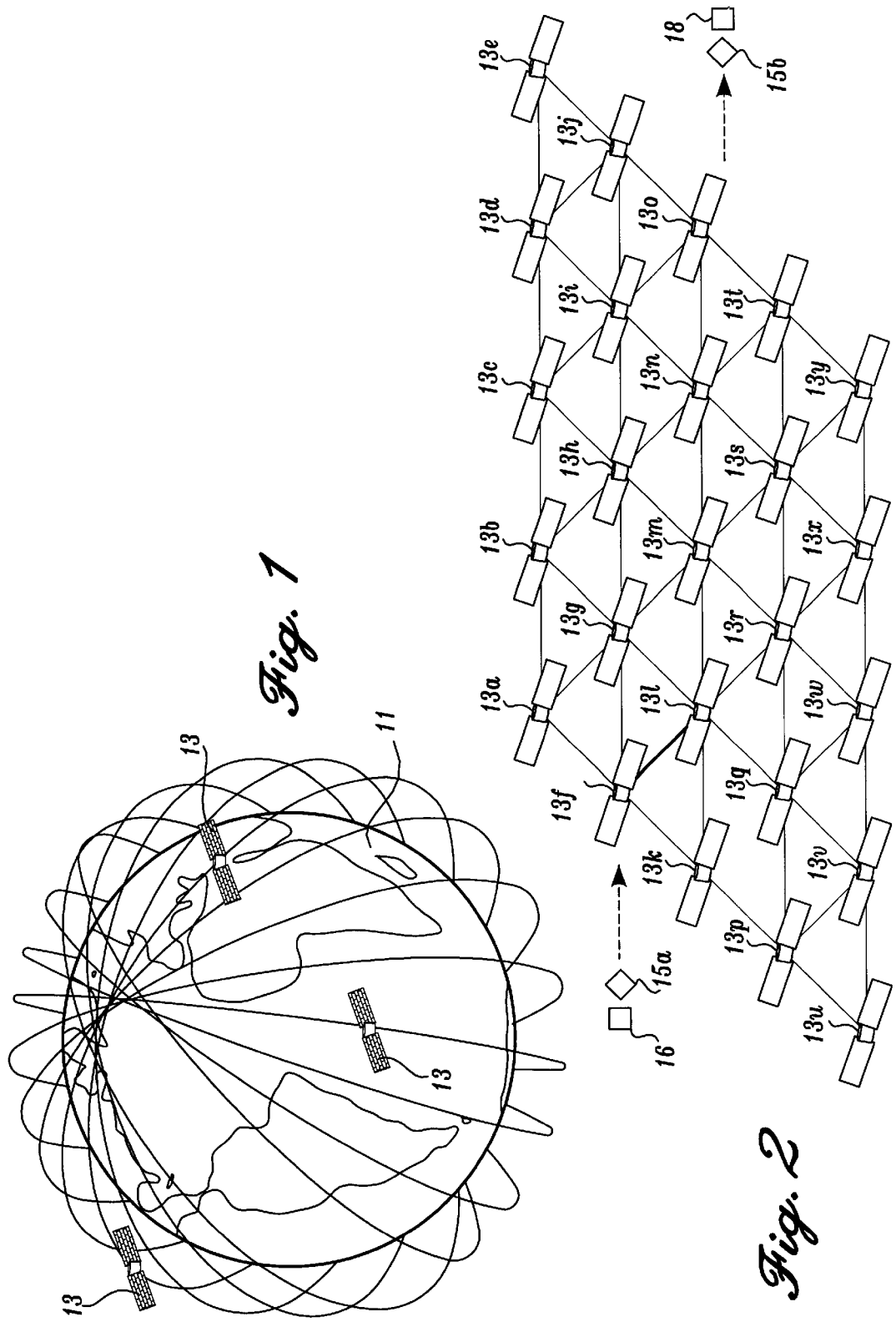

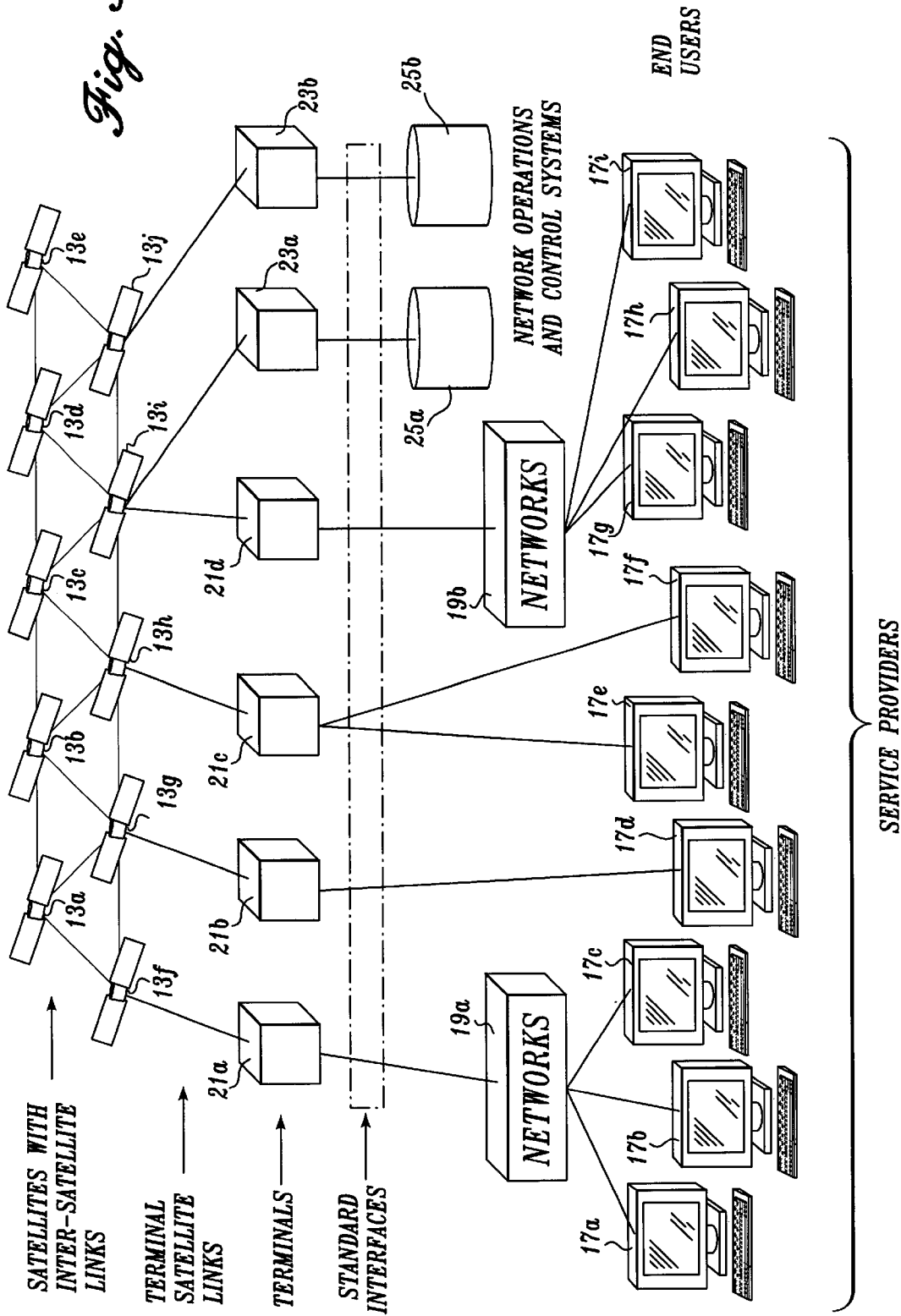

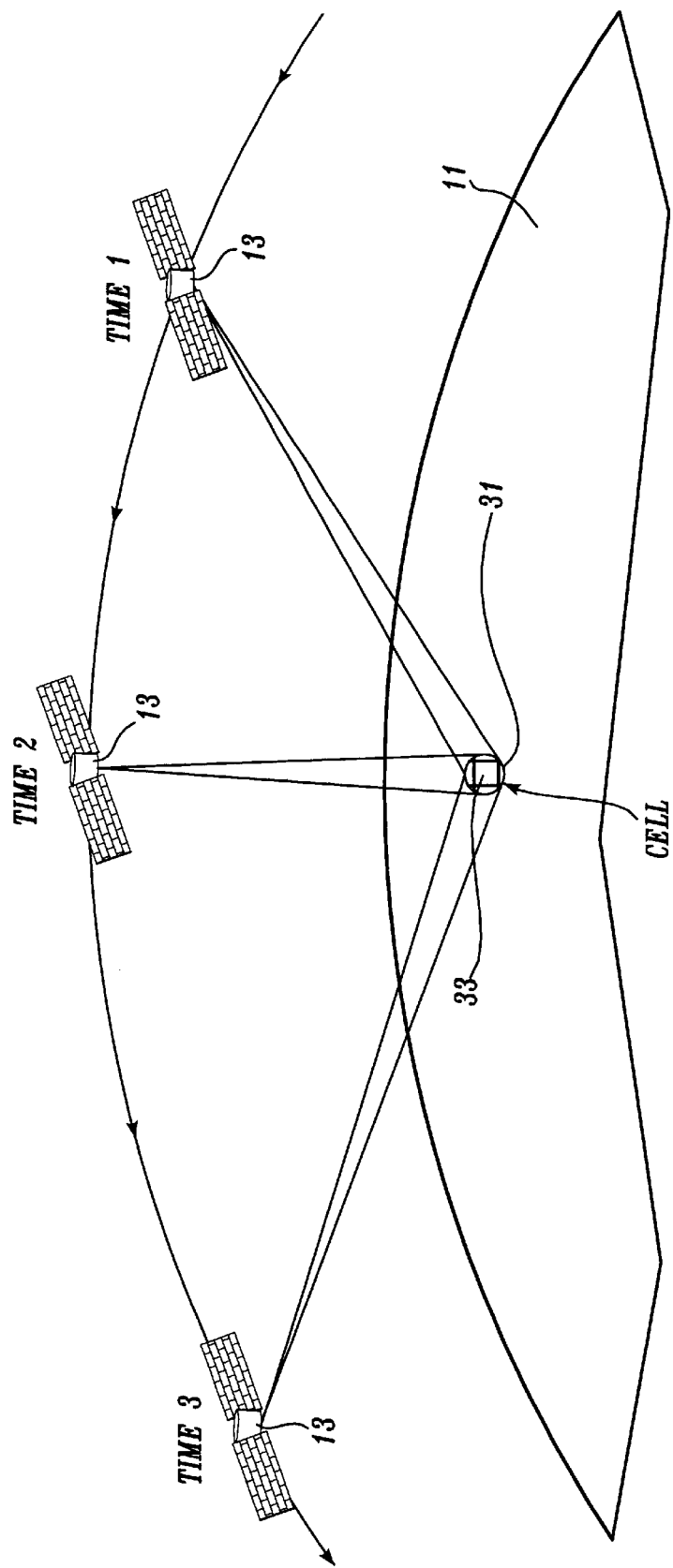

SYSTEM AND METHOD OF SEPARATELY CODING THE HEADER AND PAYLOAD OF A DATA PACKET FOR USE IN SATELLITE DATA COMMUNICATION

FIELD OF THE INVENTION

This invention relates to data communication systems and, more particularly, to digital satellite data communication systems.

BACKGROUND OF THE INVENTION

In recent years the need for global data networking capability has rapidly expanded. In order to meet this need, broadband satellite communication systems have been proposed as an alternative to land-based communication systems. One type of satellite data communication system is described in a variety of U.S. patents assigned to the assignee of this patent application, including U.S. Pat. Nos. 5,386,953; 5,408,237; 5,527,001; 5,548,294; 5,641,135; 5,642,122, and 5,650,788. These patents and other pending applications assigned to the assignee of this patent application describe a satellite communication system that includes a constellation of low-Earth orbit (LEO) satellites that implement an Earth-fixed cellular beam approach to transmitting data from one location on the Earth's surface to another location. More specifically, each LEO satellite has a communication "footprint" that covers a portion of the Earth's surface as a satellite passes over the Earth. The communication footprint defines the area of the Earth within which ground terminals can communicate with the satellite. Located within each footprint are a large number of cells. During the period of time a cell remains within the borders of a satellite footprint, ground terminals located in the cell transmit data to and receive data from the "servicing" satellite. When a satellite reaches the end of its servicing arc, another satellite in orbit is positioned to "service" the Earth-fixed cells previously covered by the satellite reaching the end of its servicing arc. During servicing, the antennas of ground terminals located in the cells continuously point toward the servicing satellite as it moves in orbit and antennas on the satellite point toward the cells during the time period within which the ground terminals in the cells are allowed to transmit data. Other LEO satellite communication systems employ a satellite-fixed beam approach to transmitting data from one location on the Earth's surface to another location.

Regardless of the nature of the LEO satellite communication system, Earth-fixed cell or satellite-fixed beam, data to be sent from one location on the Earth to another location is transmitted from a ground terminal located within a cell to the satellite serving the cell via an uplink data channel. The data is routed through the constellation of LEO satellites to the satellite serving the cell within which the ground terminal of the designated receiver is located. The latter satellite transmits the data to the receiver ground terminal via a downlink data channel. Thus, the constellation of LEO satellites and the ground terminals form a satellite data communication network wherein each ground terminal and satellite forms a node of the network.

In order for a LEO satellite data communication system to be competitive, it must have a wide bandwidth and be of relatively low cost. Low cost requires that the satellites be light in weight and relatively inexpensive to manufacture. One way of keeping satellite weight and cost low is to minimize the complexity of electronic signal processing hardware, and keep data transmission and reception power requirements low. Unfortunately, low data transmission and reception power conflicts with the need for a highly reliable data communication system because it is relatively easy to lose data contained in low-power signals. One way of improving the reliability of low-power data communication signals that is well known in the satellite communication field is to forward error correction (FEC) code the data to be transmitted. See U.S. Pat. Nos. 5,117,427; 5,446,747; and 5,473,601 for examples of FEC coding of digital data signals.

Typically, data transmissions are broken into digital data "packets" each of which include a header and a payload. The header data packets contain address and control information designed to direct the data packets through the satellite constellation to a desired ground terminal. The payload contains the information being transmitted, which is intended for the satellite or the ground terminal or both. A prior approach of transmitting the data involved either completely or partially FEC decoding and then re-encoding the header and payload data at the satellites. Since at least some payload decoding and re-encoding are required on the satellites with this approach, satellite power and complexity requirements are greater than they would be if no payload decoding and re-encoding occur on the satellites. Furthermore, once the satellites are in orbit, changes to the coding scheme are not possible.

The present invention is directed to a LEO satellite data communication system that uses FEC coding in a novel way to minimize power requirements, minimize complexity of the satellites, and maximize reliability, in part by requiring minimal decoding and re-encoding of the payload data on the satellites.

SUMMARY OF THE INVENTION

In accordance with this invention, a low-Earth orbit (LEO) satellite data communication system is provided. Data to be transmitted from one location on the Earth to another location is assembled into digital data packets each of which includes a header and a payload. The header includes address and other control information, and the payload contains the information to be transmitted. A sending ground terminal first separately encodes the header and payload with a suitable outer forward error correction (FEC) code. If desired, the symbols of the resulting header and payload codewords, derived from a single data packet, may be separately interleaved. The optionally interleaved header and payload codewords are separately inner encoded using a suitable FEC code. The thusly concatenated coded, optionally interleaved header and payload codewords are mixed to produce concatenated coded, optionally interleaved data packets. These concatenated coded, optionally interleaved data packets are transmitted to a receiving satellite via an uplink data communication channel. The receiving satellite first demixes the concatenated coded, optionally interleaved data packets to recover the concatenated coded, optionally interleaved header and payload codewords. Then the concatenated coded, optionally interleaved payload codewords are delayed while the concatenated coded header codewords are first inner decoded to remove the inner FEC code. The symbols of the resulting optionally interleaved, outer encoded header codewords are de-interleaved (if necessary) to regenerate the outer encoded header codewords. The header codewords are then further decoded to remove the outer encoding and recover the header bits of each data packet. The recovered header information is used to determine if the delayed concatenated coded, optionally interleaved payload codewords are intended for the receiving satellite, another satellite or a ground terminal. If for the receiving satellite, the resulting concatenated coded, optionally interleaved receiving satellite payload codewords are inner decoded to remove the inner FEC code. Then the symbols of the resulting interleaved, outer encoded receiving satellite payload codewords are de-interleaved (if necessary) to regenerate the outer encoded receiving satellite payload codewords. Next, the receiving satellite payload codewords are further decoded to remove the outer encoding and recover the receiving satellite payload bits of each data packet. Contrariwise, if the header information indicated that the payload codewords are intended for another satellite or for a ground terminal, the resulting concatenated coded, optionally interleaved payload codewords are applied to a hard decision circuit, which forces the payload codewords to take on +1 or −1 values, which represent logical 0 and 1. The recovered header information is then used to route the data packets through the satellite constellation to either another satellite for which they are intended or the appropriate sending satellite, i.e., the satellite positioned to transmit the data packets to the intended ground terminal. Prior to being forwarded to another satellite, the decoded header is re-encoded and the re-encoded header is combined with the still encoded payload. The next satellite receiving the resulting intersatellite data packets decombines the data packets and, then, decodes the header. If the next satellite is neither the intended satellite or the intended sending satellite, the still encoded payload is again applied to a hard decision and then the header is again re-encoded and combined with the still encoded payload to recreate another intersatellite data packet. This process is repeated until the data packet reaches the intended satellite or the intended sending satellite, i.e., the satellite positioned to send the data packet to the intended ground station. When an intersatellite data packet reaches an intended satellite, the satellite inner decodes the resulting concatenated coded, optionally interleaved receiving satellite payload codewords. Then the symbols of the resulting optionally interleaved, outer encoded receiving satellite payload codewords are de-interleaved (if necessary) and further decoded to remove the outer encoding to recover the satellite payload databits. When an intersatellite data packet reaches a sending satellite, the sending satellite re-outer encodes the header using a suitable outer FEC code. The symbols of the thusly re-outer encoded header codewords are interleaved (if desired) and, then, the optionally interleaved header codewords are re-inner encoded using a suitable inner FEC code. The thusly re-concatenated coded, optionally interleaved header codewords are mixed with the still concatenated coded, optionally interleaved payload codewords to produce re-concatenated coded, optionally interleaved data packets. The re-concatenated coded, optionally interleaved data packets are then transmitted to a receiving ground terminal via a downlink data communication channel. The receiving ground terminal first de-mixes the re-concatenated, optionally interleaved coded data packets to recover the re-concatenated coded, optionally interleaved header codewords and the still concatenated coded, optionally interleaved payload codewords. Then, the re-concatenated coded, optionally interleaved header codewords and concatenated coded, optionally interleaved payload codewords are separately decoded to remove the inner FEC code. The symbols of the outer encoded header and payload codewords are then separately de-interleaved (if necessary). Finally, the header and payload codewords are separately decoded and their respective databits recovered.

In accordance with other aspects of this invention, prior to the re-concatenated coded, optionally interleaved header codewords being mixed with the still concatenated coded, optionally interleaved payload codewords by the sending satellite, the concatenated coded, optionally interleaved payload codewords are bit inner encoded a second time. Further, after the concatenated coded, optionally interleaved header codewords and the thusly double inner concatenated coded, optionally interleaved payload codewords are demixed by the receiving ground terminal, the double inner concatenated coded, optionally interleaved payload codewords are inner decoded twice, the first time to recover the originally concatenated coded, optionally interleaved payload codewords.

In accordance with alternate aspects of this invention, prior to the re-concatenated coded, optionally interleaved header codewords being mixed with the still concatenated coded, optionally interleaved payload codewords by the sending satellite, the bits of the concatenated coded, optionally interleaved payload codewords are bit interleaved and the result inner encoded a second time. Further, after the concatenated coded, optionally interleaved header codewords and the thusly bit interleaved double inner concatenated coded, optionally interleaved payload codewords are demixed by the receiving ground terminal, the bit interleaved double inner concatenated coded, optionally interleaved payload codewords are decoded by a serial concatenated convolution code (SCCC) decoder. Bit interleaving a convolutional code which is subsequently followed by another convolutional code permits the receiving ground terminal to completely inner decode the bit interleaved double inner concatenated coded, optionally interleaved payload codewords using a single SCCC decoder.

In accordance with further aspects of this invention, the outer forward error correction code is, preferably, a Reed-Soloman (RS) or a Bose, Chaudhuri and Hocquenghem (BCH) code.

In accordance with still further aspects of this invention, the inner forward error correction code is a turbo code, such as a serial or a parallel concatenated convolution code (SCCC or PCCC), or a hybrid concatenated convolutional code (HCCC). Other suitable codes are a convolutional code, block code or trellis code.

In accordance with yet further aspects of this invention, the chosen inner code is punctured, depending on uplink and downlink requirements.

As will be readily appreciated from the foregoing description, the invention provides a switched packet data communication system that employs concatenated codes and header and payload interleaving that is ideally suited for use in a low-Earth orbit (LEO) satellite system. Because only the header and the receiving satellite payload are decoded at the satellite, as opposed to the header, the receiving satellite payload, and the payload intended for a ground terminal, satellite hardware and power requirements are substantially lowered without loss of the reliability benefits of concatenated error correction coding. Further, because the payload FEC code, for a payload which is intended for a ground terminal, is only applied and removed at the end of the transmission path, coding gain is substantially lessened. Further changes to the coding scheme are now possible after satellites are placed in orbit. Embodiments of the invention that employ a second terminal payload inner encoder at the sending satellite provide added benefits by further enhancing reliability.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a pictorial diagram showing the orbital paths of the satellites of a constellation of low-Earth orbit (LEO) satellites positioned to cover the entire surface of the Earth;

FIG. 2 is a plan view of a portion of the constellation of LEO satellites depicted in FIG. 1;

FIG. 3 is a pictorial view showing the various signal paths to and from a constellation of LEO satellites of the type depicted in FIGS. 1 and 2;

FIG. 4 is a pictorial view that shows a single LEO satellite flying over a single Earth cell in three sequential positions;

DETAILED DESCRIPTION OF THE PREFERRED EMBODIMENT

Figure 5:
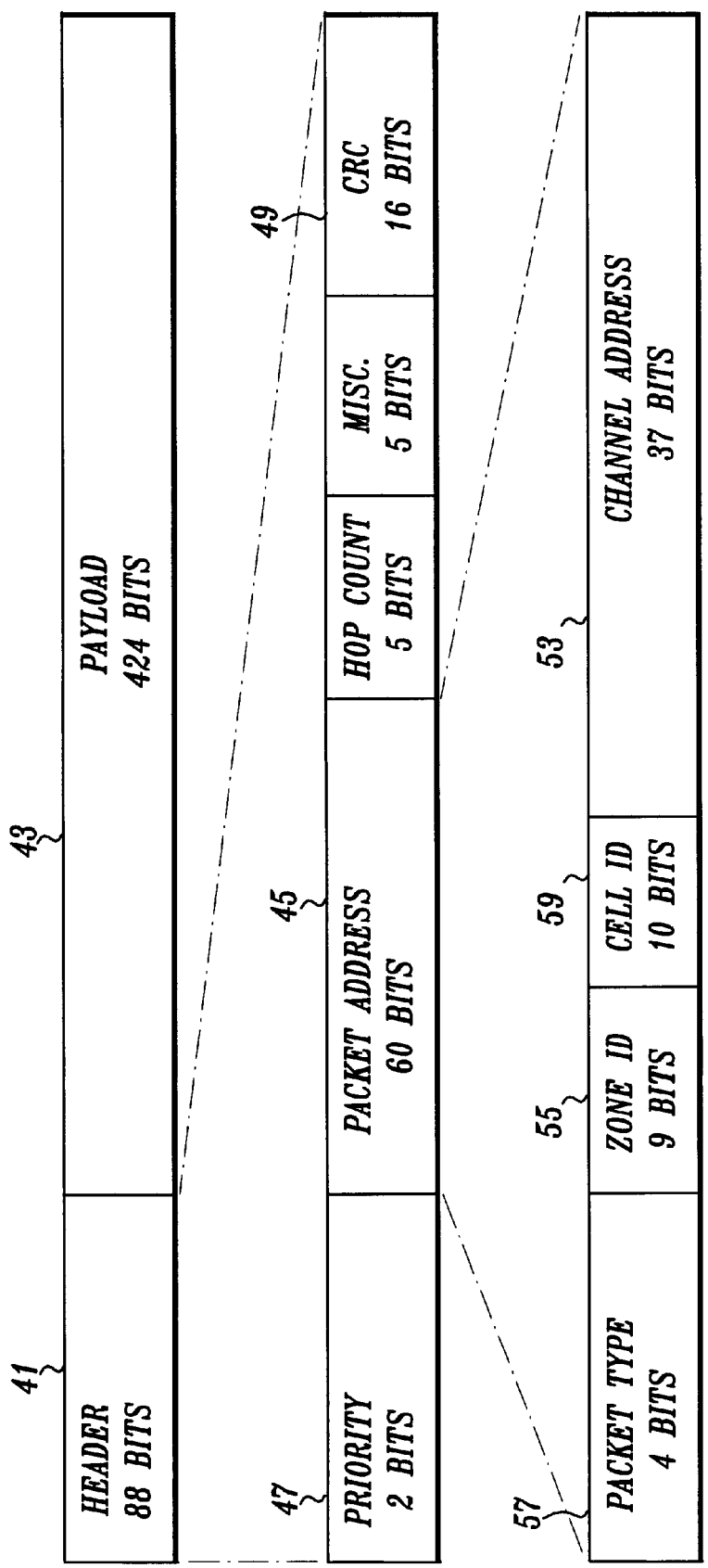
FIG. 5 illustrates a data packet of the type employed by a LEO satellite data communication system formed in accordance with the invention.

The present invention is directed to a data communication system that is ideally suited for use in a low-Earth orbit (LEO) satellite communication network. A LEO satellite communication network includes a constellation of satellites orbiting the Earth such that a majority of the Earth is within the view of at least one satellite at any point in time. One proposed LEO satellite communication network employs 288 satellites, plus spares, located in 12 polar orbit planes. Each plane includes 24 satellites at an altitude of approximately 1,350 kilometers. The path of travel of the satellites of such a network is generally depicted in FIG. 1. More specifically, FIG. 1 depicts the Earth 11 surrounded by a plurality of rings that depict the orbital planes of a plurality of satellites 13.

FIG. 2 illustrates a number of the satellites 13a, 13b, 13c ... that make up the constellation of satellites included in a LEO satellite communication network of the type illustrated in FIG. 1. The satellites are shown closer to one another for illustrative purposes only. As shown in FIG. 2, a data signal 15a, consisting of one or more data packets, is transmitted on an uplink data communication channel by a ground terminal 16 and received by a first satellite 13f that forms part of the constellation of satellites. The data packets are routed through the constellation of satellites. The routing path is dependent on network traffic. For example, the receiving or uplink satellite may forward the one or more data packets to a second satellite 13l, which forwards the data packets to a third satellite 13m, which forwards the data packets to a fourth satellite 13n. The routing continues until the data packets reach the satellite 13o associated with the ground terminal 18 that is to receive the data packets. This satellite, called the sending or downlink satellite, transmits the data packets as a data signal 15b to the receiving ground terminal 18. The receiving ground terminal forwards the data to an end user. It is to be understood that the data packets of a message may be routed through different paths in the constellation of satellites and may arrive at the ground terminal in a different order than they were sent. In this case, upon receipt at the ground terminal, the data packets are re-ordered in the correct order before data is forwarded to the end user.

FIG. 3 further illustrates the LEO satellite communication network. End users 17a, 17b, 17c ... are connected either through networks 19a and 19b ..., or directly, to ground terminals 21a, 21b, 21c ... The networks 19a, 9b, ... may, for example, be conventional switched public telephone system networks, corporate networks or other proprietary networks.

Network operations and control systems 25a and 25b are shown as communicating with the satellites via separate terminals 23a and 23b. All of the ground terminals are designed to transmit signals to and receive signals from the constellation of satellites via uplink and downlink data channels. Since LEO satellites, in contrast to geosynchronous satellites, move with respect to the Earth, the region of the Earth covered by a satellite's footprint is also constantly moving. Preferably, the LEO satellite communication network of the present invention employs Earth-fixed cellular beam technology. In an Earth-fixed cellular beam system the surface of the Earth is mapped with a number of cells. As a LEO satellite passes over the Earth, the satellite's antennas are controlled so that the beams of the antennas are steered to remain pointed at each cell located within a satellite's footprint. For a predetermined period of time, the cells located within the satellite's footprint are therefore served by the same satellite as the satellite moves in orbit over the cell. In contrast, conventional LEO satellites use a satellite-fixed beam approach in which the direction of the beams from the satellite are fixed with respect to the satellite, i.e., the beams are not steered. Although the present invention is applicable to a satellite-fixed beam as well as Earth-fixed cellular systems, an Earth-fixed cellular satellite communication system is preferred because it is believed to substantially reduce communication problems when compared to other systems.

An Earth-fixed cellular beam system is illustrated in FIG. 4. As a satellite moves in orbit with respect to the Earth, the cells located within a footprint defined by the satellite's antennas are continuously serviced by the satellite. As shown, at the beginning of the arc, at a time 1, the boundary 31 of the beam of one of the antennas of the satellite 13 covers a cell 33. At a time 2, midway in the arc, the beam from the same or another antenna is electronically or mechanically steered so that the cell is still covered by the beam. At the end of the arc, at a time 3, the beam of the antenna from the same satellite still covers the cell 33. Since the satellite antenna beams are steered to cover the cell 33 from time 1 to time 3, the cell with respect to the satellite and the Earth is "fixed." Prior to time 1, the antenna of another (upstream) satellite covered the cell 33. At time 3, the antenna of a further (downstream) satellite will begin covering the cell 33. Rather than servicing a single cell, a satellite antenna beam can be electronically controlled to serve a group of cells by hopping from cell to cell located within a predetermined grid, if desired. When a servicing satellite moves out of range, the appropriate antenna of the succeeding satellite picks up the prior cells and the antennas of that satellite point at the cells from time 1 to time 3 as the satellite moves through its servicing arc. The size of the satellite footprints is such that all regions of the Earth are covered at all points in time.

Rather than each data message being continuously transmitted, as is well known in the cellular telephone communication and other arts, data transmissions are broken into digital data "packets." As illustrated in FIG. 5, each packet includes a header 41 and a payload 43. The number of databits in the header are substantially fewer than the number of databits in the payload. In the illustrated example, the header contains 88 databits, and the payload contains 424 databits. The illustrated header includes packet address bits 45 as well as other bits, such as priority bits 47, cyclic redundancy check (CRC) bits 49, etc. The packet address bits may include, for example, channel address bits 53, zone ID bits 55, packet type bits 57, and cell ID bits 59. As will be appreciated by those skilled in the art of telecommunications and others, FIG. 5 illustrates merely one example of many, many possible header and payload databit relationships.

As will be readily appreciated from the foregoing description, the header bits, in essence, contain address and control information designed to direct the data packets either to the correct satellite(s) if the related payload is destined for one or more of the satellites in the LEO satellite constellation or through the satellite constellation to a desired ground terminal if the related payload is destined for a ground terminal. The payload, of course, contains the information being transmitted. If intended for a ground terminal, the ground terminal reassembles the packets of received data, if they are received out of order, in the appropriate sequential manner prior to forwarding the data packets to an end user. Preferably, messages intended for satellites are contained in a single data packet. If multiple related data packets are required to send a message to a satellite(s), the satellite(s) reassembles the packets of received data in the order required to respond to the message.

The present invention is directed to a method and apparatus for transmitting data packets of the type generally illustrated in FIG. 5 through a LEO satellite communication system of the type illustrated in FIGS. 1–4 in a way that enhances reliability while minimizing power consumption. This is accomplished by using concatenated coding techniques, optionally interleaving the header and payload databits, and decoding only the header and receiving satellite payload portions of the data packets on the satellites, but not the payload portions of the data packets intended for other satellites or ground terminals. As will be better understood from the following description, in some versions of the invention the payload portions of the data packets intended for a ground terminal are further encoded by downlink sending satellites prior to being transmitted to a receiving ground station. As also will be better understood from the following description, decoded header portions of data packets are re-encoded prior to being transmitted from satellite-to-satellite via intersatellite links.

As better described below, concatenated coding is accomplished by first separately forward error correction (FEC) coding the header and payload databits. The outer error correction coding is accomplished by conventional FEC encoders, such as a Reed-Soloman (RS) or Bose, Chaudhuri and Hocquenghem (BCH) encoder. Then the symbols of the header and payload codewords derived from a single data packet and resulting from the outer encoding are separately interleaved, if desired. Thereafter, the optionally interleaved codewords are again separately FEC coded. This inner error correction coding is accomplished by other conventional FEC encoders. A suitable inner encoder is a convolutional encoder. Suitable alternatives are block and trellis encoders or turbo encoders, such as parallel, serial or hybrid concatenated convolution coders (PCCC, SCCC, and HCCC). If desired, the encoding signal may be punctured, depending on the requirements of the link. After encoding, the concatenated coded, optionally interleaved header and payload data packets are mixed and modulated. The modulated signal is then transmitted via an uplink data channel to the satellite in the LEO satellite constellation serving the cell within which the transmitter lies.

The satellite receiving the uplinked data demodulates and demixes the received signal and applies the header codewords to an inner decoder, while delaying the payload codewords. The inner decoder decodes the concatenated coded, optionally interleaved header codewords and recovers the optionally interleaved, outer encoded header codewords. The symbols of the optionally interleaved, outer encoded header codewords are de-interleaved, if necessary, resulting in the recovery of the outer encoded header codewords. The outer encoded header codewords are decoded by a header outer decoder, resulting in the recovery of the original header data. The extracted header data is used to identify and separate the delayed payload codewords into receiving satellite payload codewords, i.e., codewords intended for the receiving satellite, and payload codewords intended for another satellite(s) or for a ground terminal. Receiving satellite payload codewords are applied to an inner decoder, which decodes the resulting concatenated coded, optionally interleaved receiving satellite payload codewords and recovers the optionally interleaved, outer encoded receiving satellite payload codewords. The symbols of the optionally interleaved, outer encoded receiving satellite payload codewords are then de-interleaved, if required, resulting in the recovery of the outer encoded receiving satellite payload codewords. The outer encoded receiving satellite payload codewords are further decoded by an outer decoder, resulting in the recovery of the original receiving satellite payload data. Contrariwise, payload codewords intended for another satellite(s) or for a ground terminal are applied to a hard-decision circuit. The hard-decision circuit forces the payload codeword databits, which can have a continuum of magnitude values above or below an average value, to take on +1 or −1 values, representing logical 0 and 1. That is, the hard decision circuit "squares up" the payload codeword databits. Unlike the concatenated coded, optionally interleaved receiving satellite payload codewords, the concatenated coded, optionally interleaved payload codewords intended for another satellite or for a ground terminal, are not inner decoded, de-interleaved (if required) or outer decoded.

The extracted header data is also used to route the data packets through the LEO satellite constellation to either another satellite(s) for which they are intended or the satellite serving the cell within which the intended receiving ground terminal is located. Prior to being forwarded by the receiving satellite to another satellite in the constellation via an intersatellite link, the receiving satellite re-encodes the decoded header data and combines the header codewords with the payload codewords to be forwarded. Satellites receiving the combined codewords decombine the codewords and, then, decode the header codewords. The decoded header data is analyzed to determine if the data packet is intended for the satellite receiving the combined codewords. If the next satellite is not either the intended satellite (in the case of data packets destined for a satellite) or the downlink sending satellite (in the case of data packets destined for a ground terminal), the next satellite re-encodes the decoded header, passes the payload codewords through a hard decision circuit, re-combines the resulting header codewords and the payload codewords and forwards the recombined codewords to yet another next satellite in the data packet route.

If the receiving satellite is the satellite for which the data packet was intended, the receiving satellite identifies and inner decodes, de-interleaves (if necessary) and outer decodes the concatenated coded, optionally interleaved receiving satellite payload codewords to produce receiving satellite payload databits. On the other hand, if the receiving satellite is the satellite serving the cell within which the intended receiving ground terminal is located, i.e., is the sending satellite, the sending satellite re-outer encodes the header data by passing the header data through a conventional FEC encoder that may be similar to, or different from, the one used on the uplink. Thereafter, the symbols of the re-outer encoded header codewords are interleaved, if desired. The optionally interleaved codewords are then re-inner encoded. Again, this is accomplished by a conventional FEC encoder, such as a convolutional encoder. The thusly re-concatenated coded, optionally interleaved header codewords are mixed with the still concatenated coded, optionally interleaved payload codewords. The result of the mixing is modulated and transmitted to the receiving ground terminal via a downlink data channel.

The receiving ground terminal demodulates the received signal and applies the demodulated signal to a demixer. The demixer separates the demodulated signal into the re-concatenated coded, optionally interleaved header codewords and the still concatenated coded, optionally interleaved payload codewords. The re-concatenated coded, optionally interleaved header codewords and the still concatenated coded, optionally interleaved payload codewords are separately decoded by a header inner decoder and a payload inner decoder, resulting in the recovery of the re-outer encoded, optionally interleaved header codewords and the outer encoded, optionally interleaved payload codewords. The symbols of the optionally interleaved, re-outer encoded header and optionally interleaved, outer encoded payload codewords are separately de-interleaved (if necessary) by a header de-interleaver and a payload de-interleaver, resulting in the recovery of the re-outer encoded header and the outer encoded payload codewords. The recovered re-outer encoded header and outer encoded payload codewords are separately decoded by a header outer decoder and a payload outer decoder, resulting in the recovery of the header data and the original payload data. Information contained in the header data is then used to reassemble, in the appropriate order, the data packets prior to the data packets being forwarded to an end user.

Figure 6:
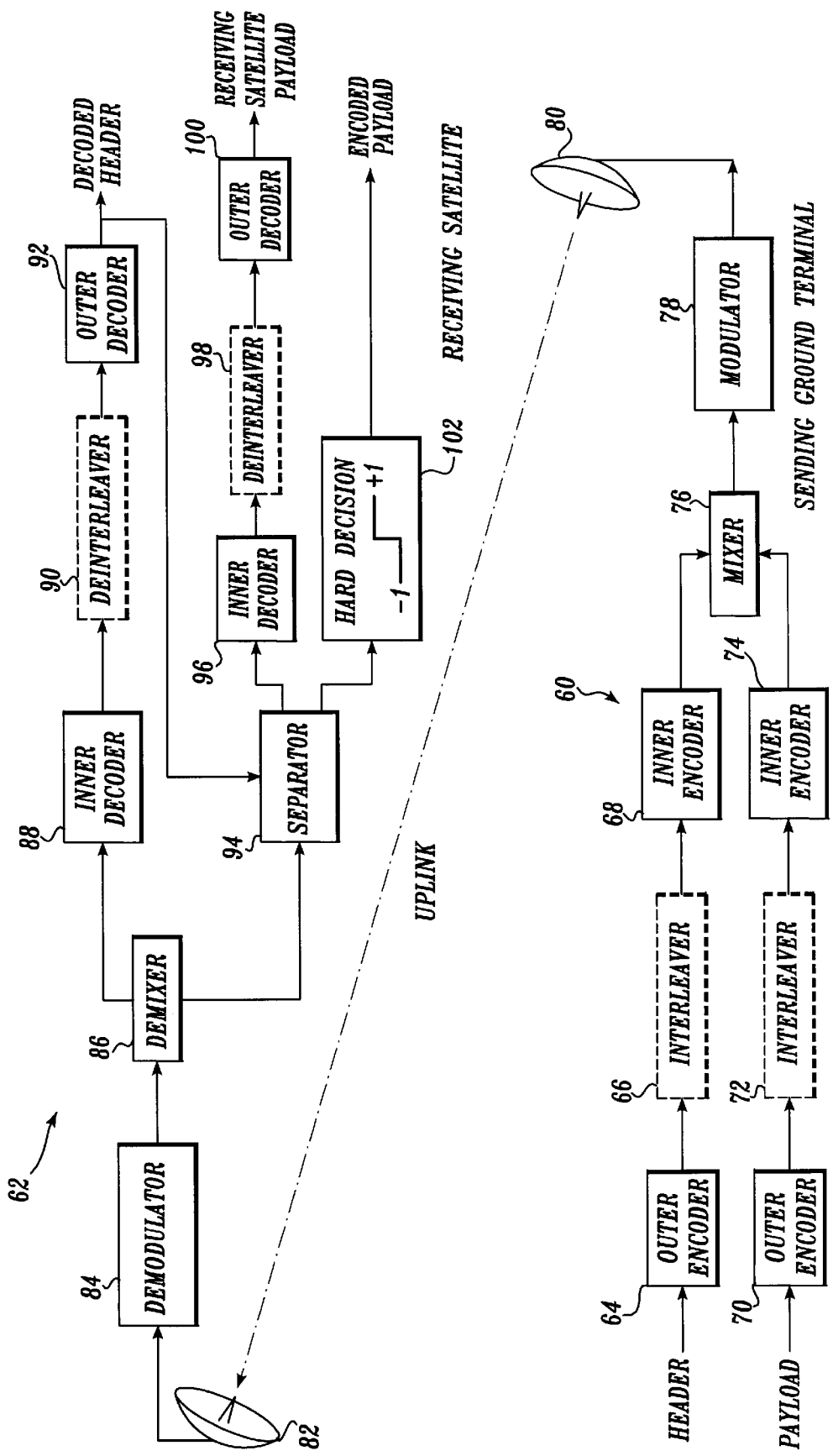
FIG. 6 is a functional block diagram that illustrates the uplink components of a LEO satellite data communication system formed in accordance with the invention.

Returning to the drawings, FIG. 6 is a functional block diagram illustrating the major components of the sending ground terminal 60 and the receiving satellite 62 involved in the uplink of the presently preferred embodiment of the invention. The sending ground terminal 60 includes a header outer encoder 64, an optional header interleaver 66, a header inner encoder 68, a payload outer encoder 70, an optional payload interleaver 72, a payload inner encoder 74, a mixer 76, a modulator 78, and an antenna 80. The header databits of a data packet are FEC coded by the header outer encoder 64. As noted above, suitable header outer encoders are RS encoders and BCH encoders. Likewise, the payload databits of a data packet are FEC coded by the payload outer encoder 70. As with the header outer encoder 64, the payload outer encoder 70 is a conventional FEC encoder, such as an RS or a BCH encoder. Obviously, the header and payload outer encoders must be compatible.

The header and payload outer encoders produce header and payload codewords. The symbols of the header and payload codewords produced by the header and payload outer encoders relate to a single data packet. If desired, the symbols of the header and payload codewords may be separately interleaved by the header and payload interleavers 66 and 72, respectively. Interleaving the symbols of the header and payload codewords has several advantages. First, it reduces the complexity of the header outer encoder, particularly if the header outer encoder is an RS encoder. Symbol interleaving also reduces the effect of burst errors that are inherent in convolution coding and decoding. Although interleaving has the above advantages, interleaving is not necessary and may be eliminated, if desired.

The separate, optionally interleaved, outer encoded header and payload codewords are separately inner FEC encoded by the header and payload inner encoders 68 and 74, respectively. While various types of encoders can be used, preferably, the inner encoder is a convolutional encoder. Alternative encoders are block and trellis encoders or turbo encoders, such as serial, parallel or hybrid concatenated convolution (SCCC, PCCC or HCCC coders). If chosen, the SCCC, PCCC or HCCC may be punctured, depending upon the requirements of the link. The resulting concatenated coded, optionally interleaved header codewords and concatenated coded, optionally interleaved payload codewords are combined by the mixer 76. The thusly mixed concatenated coded, optionally interleaved data packets are modulated by the modulator 78. The output of the modulator 78 is applied to the antenna 80 of the ground terminal 60.

The antenna 80 of the ground station 60 transmits the modulated, mixed, concatenated coded, optionally interleaved data packets to an antenna 82 of the receiving satellite 62 via an uplink data channel.

In addition to the antenna 82, the receiving satellite 62 includes a demodulator 84, a demixer 86, a header inner decoder 88, an optional header de-interleaver 90, a header outer decoder 92, a separator 94, a payload inner decoder 96, an optional payload de-interleaver 98, a payload outer decoder 100, and a payload hard-decision circuit 102. The received modulated, mixed, concatenated coded, optionally interleaved data packets are first demodulated by the demodulator 84. The demodulated data packets are demixed by the demixer 86 to recover the concatenated coded, optionally interleaved header codewords and the concatenated coded, optionally interleaved payload codewords. The concatenated coded, optionally interleaved payload codewords are delayed at the separator 94 while the concatenated coded, optionally interleaved header codewords are decoded and de-interleaved (if necessary). More specifically, the concatenated coded, optionally interleaved header codewords are first decoded by the inner decoder 88 to recover the optionally interleaved, outer encoded header codewords. Depending upon the nature of the inner encoder 68 of the sending ground terminal 60, the inner decoder 88 may be a turbo decoder or a Viterbi decoder. The symbols of the optionally interleaved, outer encoded header codewords are then de-interleaved by the header de-interleaver 90, if necessary. That is, the symbols of the outer encoded header codewords are de-interleaved by the de-interleaver if the symbols of the outer encoded are interleaved. If the symbols of the outer encoded header codewords are not interleaved, the de-interleaver 90 is not included. Next, the outer encoded header symbols are outer decoded by the header outer decoder 92 to recover the original header data.

The original, i.e., decoded, header data is applied to the separator 94. Based on the decoded header data, the separator directs the delayed concatenated coded, optionally interleaved payload codewords to either the inner decoder 96 or to the hard decision circuit 102. Concatenated coded, optionally interleaved payload codewords of data packets intended for the receiving satellite are directed to the inner decoder and concatenated coded, optionally interleaved payload codewords of data packets intended for another satellite or for a ground terminal are directed to the hard decision circuit.

Concatenated coded, optionally interleaved payload codewords of data packets intended for the receiving satellite 62 are decoded and de-interleaved (if necessary) while concatenated coded, interleaved payload codewords of data packets not intended for the receiving satellite 62 are not decoded and de-interleaved by the receiving satellite.

Concatenated coded, optionally interleaved payload codewords of data packets intended for the receiving satellite are first decoded by the payload inner decoder 96. This decoding recovers the optionally interleaved, outer encoded payload codewords intended for the receiving satellite. If necessary, the payload de-interleaver 98 then de-interleaves the symbols of the interleaved, outer encoded receiving satellite payload codewords. If the outer encoded receiving satellite payload codewords are not interleaved, the payload de-interleaver is not included and this step is eliminated. The resulting outer encoded payload symbols intended for the receiving satellite, i.e., the receiving satellite payload codewords, are decoded by the payload outer decoder 100 resulting in the recovery of the original receiving satellite payload data.

Contrariwise, as noted above, concatenated coded, optionally interleaved payload codewords intended for another satellite or for a ground terminal are applied to the hard decision circuit 102, which forces the bits of the payload data packets to take on +1 or −1 values. In essence, the hard decision circuit "squares up" the bits of the concatenated coded, optionally interleaved payload codewords. The concatenated coded, optionally interleaved payload codewords remain inner encoded, optionally interleaved and outer encoded.

Figure 7:
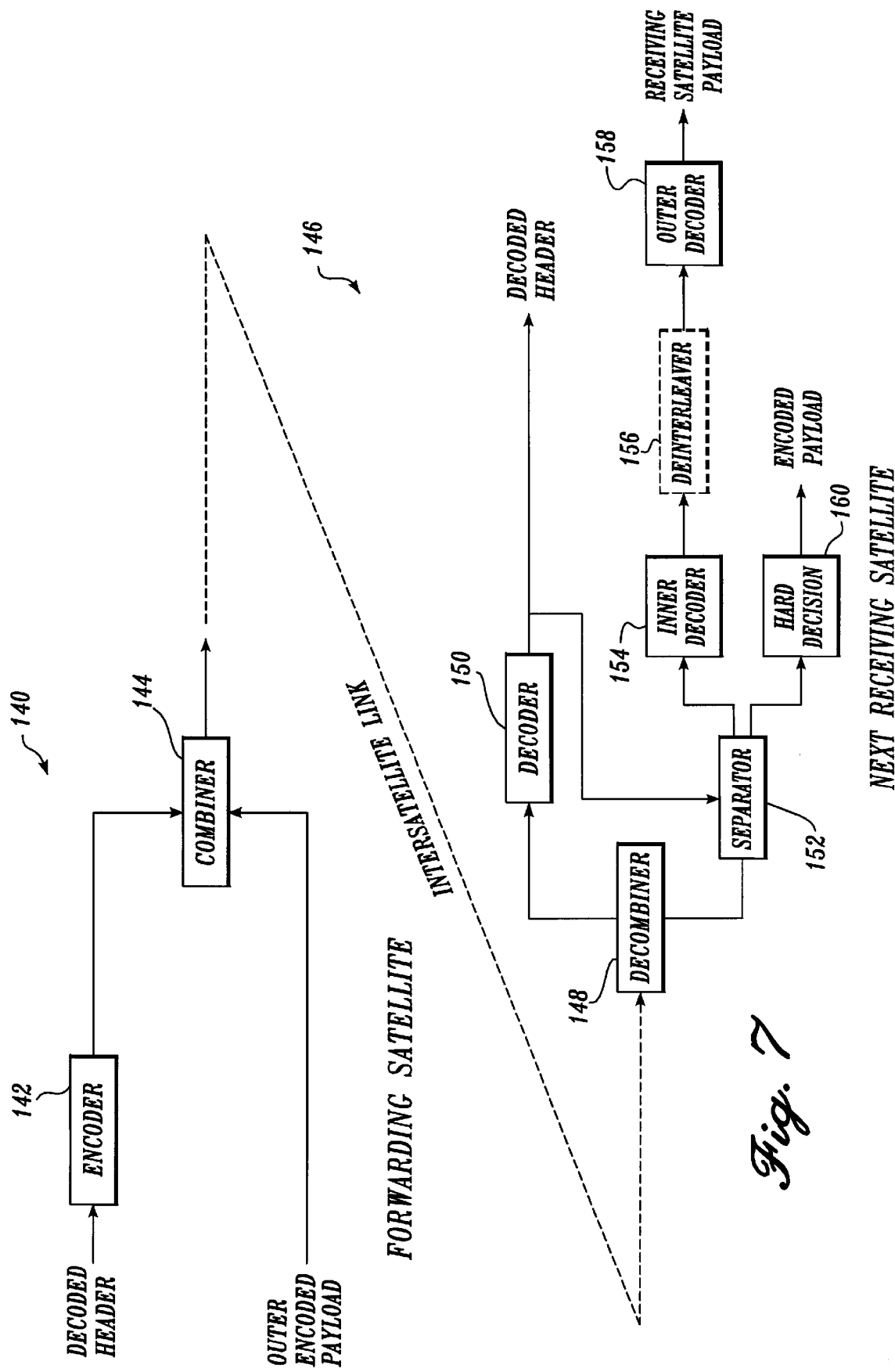
FIG. 7 is a functional block diagram that illustrates the interlink components of a LEO satellite data communication system formed in accordance with this invention.

As noted above, the header data is also used to direct the concatenated coded, optionally interleaved payload codewords through the constellation of satellites to either an intended receiving satellite or a satellite positioned to transmit the payload codewords to the receiving ground terminal associated with the intended end user. In this regard, as shown in FIG. 7 and more fully described below, the forwarding satellite 140, which in the case of FIG. 6 is the receiving satellite 62, re-encodes the decoded header databits and then combines the new header codewords with the still encoded, optionally interleaved payload codewords prior to forwarding the resulting data packets to the next satellite in the data packet route. Subsequent satellites decombine the data packets into header and payload portions. The header portions are decoded to obtain the original header databits. The information contained in the header databits is used to determine if the data packet is intended for the receiving satellite or to be forwarded to yet another satellite. If intended for the receiving satellite, the payload codewords of the data packet are decoded. If the data packet is to be forwarded to another satellite, the payload codewords are passed through a hard decision circuit, the header databits are re-encoded and the new header codewords and the payload codewords are recombined prior to the data packet being forwarded.

As shown in FIG. 7, the forwarding satellite 140 includes an encoder 142 for re-encoding the decoded header and a mixer or a combiner 144 for combining the symbols of the re-encoded header codewords or data packet with the symbols of the still encoded payload codewords of the data packet. The resulting recombined data packet is forwarded by an intersatellite link to the next satellite 146 in the route. The encoder 142 forward error correction codes the decoded header databits. While shown as a single encoder, the encoder 142 could comprise outer and inner FEC encoders and if desired, an interleaver similar to the header outer and inner FEC encoders 64 and 68 and the header interleaver 66 illustrated in FIG. 1 and described above. As a result, both the header and the payload are forward error correction coded prior to data packets being routed to the next satellite.

As also shown in FIG. 7, the next receiving satellite 146 includes a demixer or decombiner 148 for separating the FEC encoded header and payload portions of received data packets. The header portion is forwarded to a decoder 150 and the payload portion is forwarded to a separator 152. The decoder decodes the re-encoded header to obtain the original header databits. The information contained in the header databits is used by the separator to determine if the data packet is or is not intended for the receiving satellite. The separator 152 delays the encoded payload portion of received data packets by the time required for the decoder 150 to decode the header portion of received data packets.

As before, the payload codewords of data packets intended for the receiving satellite are decoded and de-interleaved (if necessary) while the payload codewords of data packets intended for another satellite or for a ground terminal are not decoded and de-interleaved. More specifically, payload codewords intended for the receiving satellite are first decoded by an inner decoder 154. This decoding recovers the optionally interleaved, outer encoded payload codewords intended for the receiving satellite. If necessary, an optional payload de-interleaver 156 then de-interleaves the symbols of the optionally interleaved, outer encoded payload codewords intended for the receiving satellite. The resulting outer encoded receiving satellite payload symbols are decoded by a payload outer decoder 158 resulting in the recovery of the original payload databits intended for the receiving satellite.

The payload codewords of data packets intended for yet another satellite or for a ground terminal are applied to a hard decision circuit 160, which forces the bits of the payload codewords to take on +1 or −1 values. Such payload codewords remain inner encoded, optionally interleaved and outer encoded. The next receiving satellite then becomes the forwarding satellite, which, as described above, re-encodes the decoded header databits, combines the resulting new header codewords with the payload codewords and transmits the resulting data packet to yet another next satellite. As a result, as the data packets are routed through the intersatellite links of the constellation of satellites, the payload codewords are only decoded and de-interleaved (if necessary) when they are received by the satellite for which the payload was intended. Payload codewords intended for a ground terminal are not decoded as they transit the constellation of satellites. While such payload codewords are enhanced by a hard decision circuit at each satellite, they are not decoded.

Figure 8:
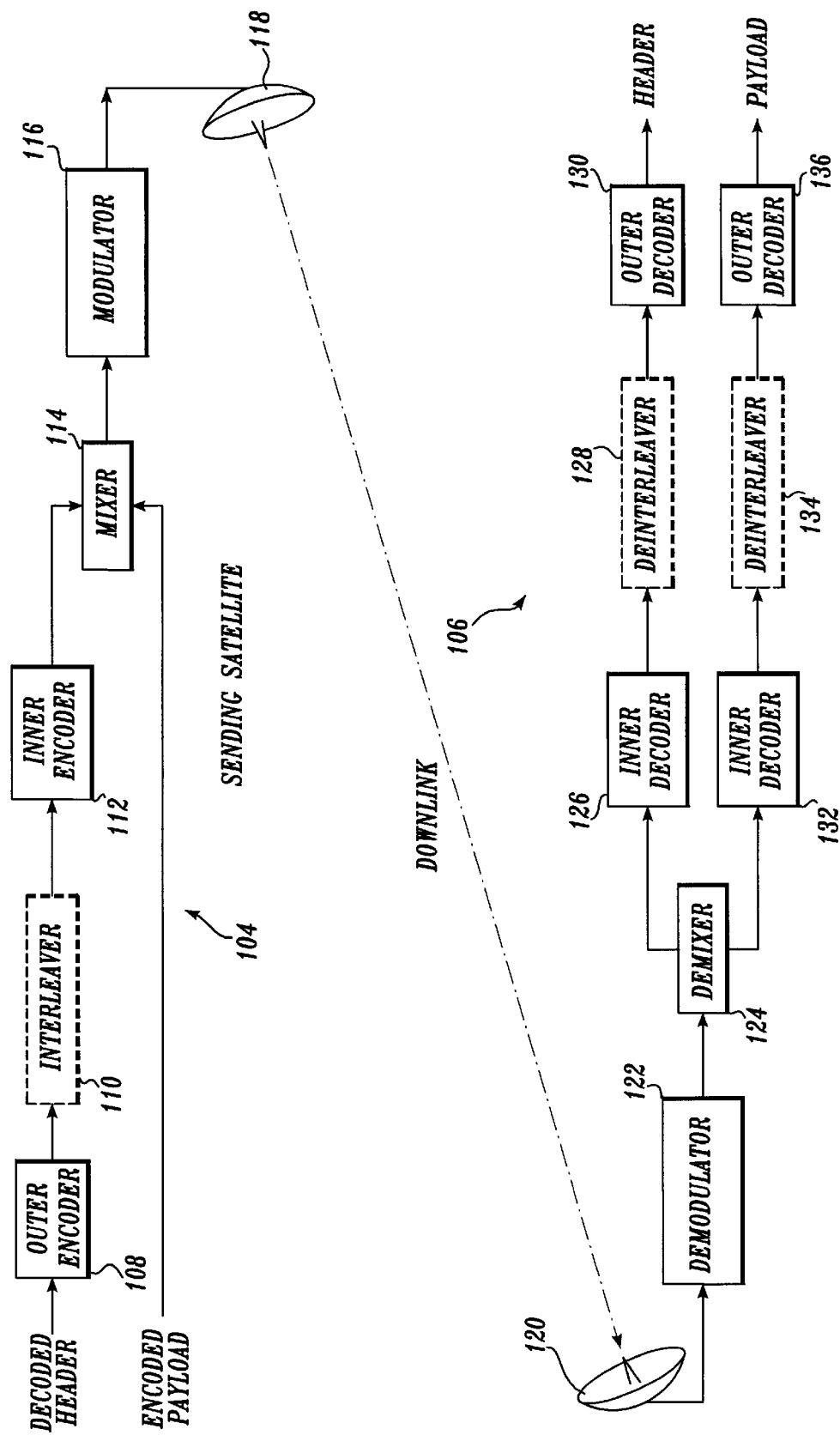
FIG. 8 is a functional block diagram that illustrates the downlink components of a LEO satellite data communication system formed in accordance with this invention.

Ultimately, data packets intended for a ground terminal reach a sending satellite, i.e., a satellite positioned to serve the intended ground terminal. As shown in FIG. 8, the sending satellite 104 includes a header outer encoder 108, an optional header interleaver 110, a header inner encoder 112, a mixer 114, a modulator 116, and an antenna 118. The header databits are re-outer encoded by the header outer encoder 108. As before, the header outer encoder may be an RS or BCH encoder, for example. Obviously, the symbols of the outer encoded header codewords must be compatible with the symbols of the still outer encoded payload codewords. The symbols of the re-outer encoded header codewords are interleaved, if desired, by the optional header interleaver 110. The header inner encoder 112 re-inner encodes the optionally interleaved, re-outer encoded header codewords. As before, the presently preferred inner encoder 112 is a convolution encoder. Alternatively, the inner encoder may be a block encoder, a trellis encoder or a turbo encoder, such as a PCCC, SCCC, or HCCC. Depending on the requirements of the link, the output may be punctured. The re-concatenated coded, optionally interleaved header codewords and still concatenated coded, optionally interleaved payload codewords are mixed by the mixer 114 and thereafter modulated by the modulator 116. The modulated, mixed, concatenated coded, optionally interleaved data packets are applied to the antenna 118 of the sending satellite 104.

The antenna 118 of the sending satellite 104 transmits the modulated, mixed, concatenated coded, optionally interleaved data packets to the antenna 120 of the receiving ground terminal 106 via a downlink data channel. In addition to the antenna 120, the receiving ground terminal 106 includes a demodulator 122, a demixer 124, a header inner decoder 126, an optional header de-interleaver 128, a header outer decoder 130, a payload inner decoder 132, an optional payload de-interleaver 134, and a payload outer decoder 136.

The received modulated, mixed, concatenated coded, optionally interleaved data packets are demodulated by the demodulator 122. Then the demixer 124 demixes the demodulated data packets recovering the re-concatenated coded, optionally interleaved header codewords and the concatenated coded, optionally interleaved payload codewords. The header inner decoder 126 and the payload inner decoder 132 decode the re-concatenated coded, optionally interleaved header codewords and concatenated coded, optionally interleaved payload codewords to recover the optionally interleaved, outer re-encoded header codewords and the optionally interleaved, outer encoded payload codewords, respectively. The symbols of the optionally interleaved outer re-encoded header codewords are de-interleaved, if necessary, by the optional header de-interleaver 128 and the symbols of the optionally interleaved, outer encoded payload codewords are de-interleaved, if necessary, by the optional payload de-interleaver 134. Thereafter, the outer re-encoded header codewords are decoded by the header outer decoder 130, and the outer encoded payload codewords are decoded by the payload outer decoder 136, resulting in the recovery of the header and payload databits. The header databits are used to assemble the payload databits contained in a plurality of data packets in the appropriate order and direct the reassembled data packet to the end user designated in the header databits as the recipient of the transmitted data.

Figure 9:
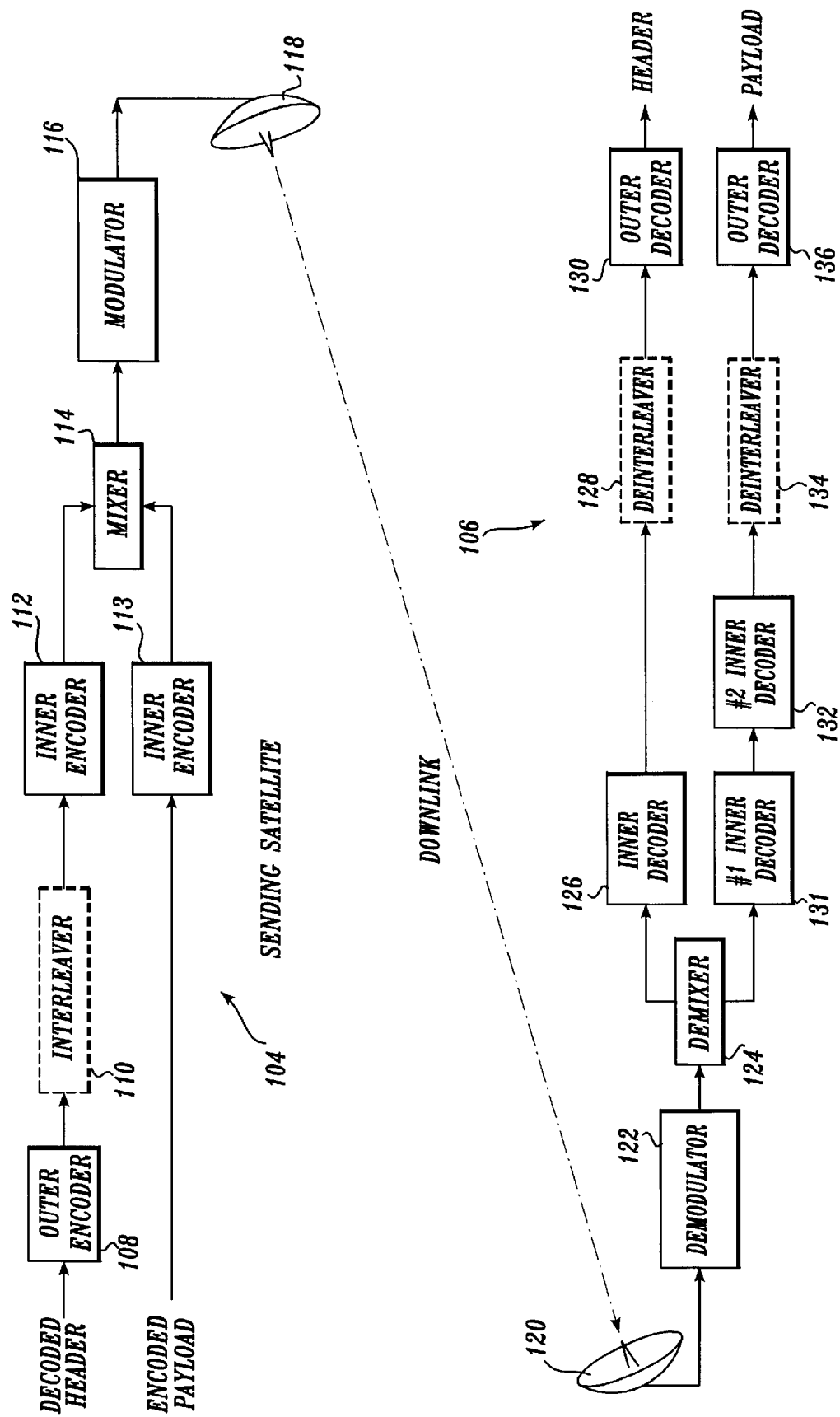
FIG. 9 is a functional block diagram similar to FIG. 8 that illustrates alternate downlink components of a LEO satellite data communication system formed in accordance with this invention.
Figure 10:
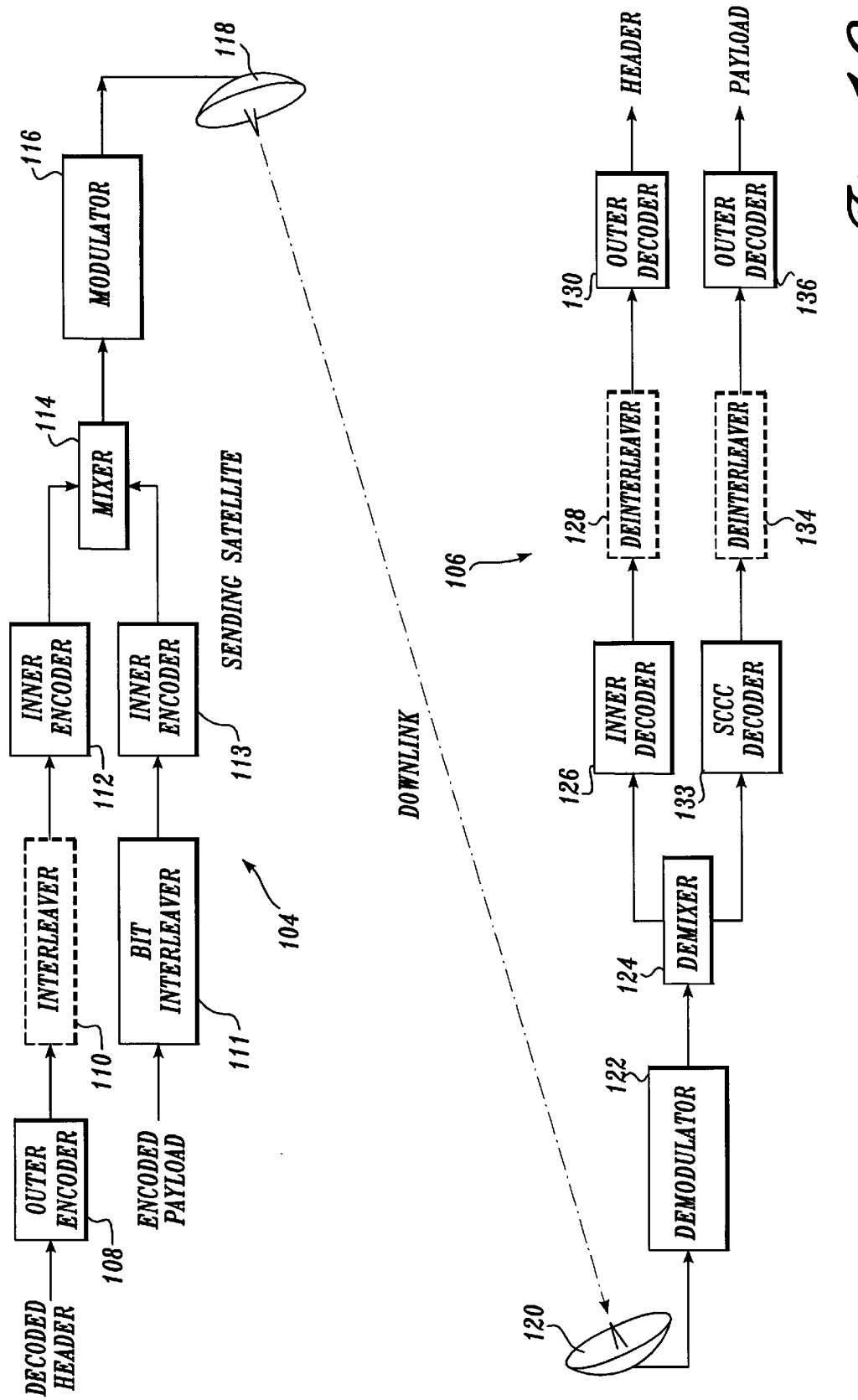
FIG. 10 is a functional block diagram similar to FIG. 8 that illustrates other alternate downlink components of a LEO satellite data communication system formed in accordance with this invention.

FIGS. 9 and 10 are functional block diagrams of alternate downlink data packet communication systems of the type shown in FIG. 8. FIG. 9 is similar to FIG. 8 with the addition of a payload inner encoder 113 on the sending satellite 104 and an additional inner decoder 131 at the receiving ground terminal 106. The payload inner encoder further inner encodes the still concatenated coded, optionally interleaved payload codewords prior to being mixed with the re-concatenated coded, optionally interleaved header codewords by the mixer 114. Thus, the payload portion of the resulting data packets carries two inner codes, i.e., it has been inner encoded twice.

At the receiving ground terminal 106, after demodulation and demixing, the concatenated coded, optionally interleaved payload codewords are serially passed through the additional (first) inner decoder 131 before passing through the original (second) inner decoder 132. The additional or first payload inner decoder 131 removes the payload inner code applied by the inner encoder 113 of the sending satellite 104, recovering the original concatenated coded, optionally interleaved payload codewords. The concatenated coded, optionally interleaved payload codewords are applied to the second inner decoder 132 which removes the inner code Applied by the inner encoder 74 of the sending ground terminal 60. The optionally interleaved, outer encoded payload codewords are then de-interleaved (if necessary) and outer decoded as described above in connection with FIG. 8.

FIG. 10 modifies the sending satellite 104 shown in FIG. 9, by adding a payload bit interleaver 111 before the second payload inner encoder 113. At the ground terminal 106, the first and second inner decoders 131 and 132 (FIG. 9) are replaced with a serial concatenated convolutional code (SCCC) decoder 133. After being demodulated and demixed by the receiving ground terminal 106, the concatenated coded, optionally interleaved payload codewords are applied to the SCCC. An SCCC decoder is used instead of two inner decoders because an SCCC decoder can completely inner decode a convolutional code followed by a bit interleaver followed by another convolutional code. After the payload codewords are completely inner decoded by the SCCC decoder 133, the payload codewords are de-interleaved (if necessary) and outer decoded as shown in FIG. 8 and described above.

As will be readily appreciated by those skilled in the art and others, a LEO satellite data communication system formed in accordance with the invention has a number of advantages. Because no decoding of payloads intended for a ground terminal is required to be performed at the satellites and because decoding of payloads intended for a satellite are only decoded at the intended satellite, less satellite power, hardware, and complexity are required. Also, changes to the coding scheme are now possible after the satellites are in orbit. Applying separate outer codes to the header and payload in a LEO satellite system of the type described above results in a system that allows separate bit error rate (BER) requirements to be applied to the payload and header. The BER requirements can differ because the payload requirement is end-to-end, while the header requirement is per link. The end-to-end requirement of the payload allows an end-to-end FEC encoding scheme to be used. The use of such a scheme reduces the coding gain required of each link. Because the header must be decoded per link, the possibility of end-to-end FEC encoding is eliminated. The use of a concatenated coding system allows both objectives to be met.

While the presently preferred embodiment of the invention has been illustrated and described, it should be understood that various changes can be made therein. For example, while, for ease of illustration, the coding, interleaving, and decoding elements are depicted as discreet blocks in FIGS. 6, 7, 8, 9 and 10, it is to be understood that the functions associated with the blocks can be carried out in various ways. The functions can be implemented in hardware, software, or a combination of hardware and software. As noted above, the number of header and payload databits can vary over a wide range and can contain information other than that shown in FIG. 5 and described above. Further, the uplink and downlink headers may be different from the intersatellite link header, depending upon the requirements of a particular system. Further, the intersatellite headers may be of different length than the uplink and downlink headers.

Moreover, it will be appreciated that the selection of the encoding scheme will depend on the errors introduced in the uplink intersatellite link and downlink data channels, as well as the acceptable bit error rate for the particular application. Further, the invention can be used with communication systems other than Earth-fixed cell satellite communication networks, including satellite-fixed antenna and other types of satellite communication systems. Hence, within the scope of the appended claims, it is to be understood that the invention can be practiced otherwise than as specifically described herein.

The embodiments of the invention in which an exclusive property or privilege is claimed are defined as follows:

1. A data communication system for a communication network comprising a constellation of low-Earth orbit (LEO) satellites and ground terminals for sending data packets to and receiving data packets from the low-Earth orbit satellites forming said constellation, said data packets including header databits and payload databits, said header databits including information regarding the destination of the payload databits, said data communication system comprising:

a forward error correction (FEC) coding system located in said ground terminals for: (i) separately outer FEC encoding the header and payload databits of said data packets; (ii) separately inner FEC encoding said outer encoded header and payload codewords to produce concatenated coded header and payload codewords; (iii) mixing said concatenated coded header and payload codewords to produce concatenated coded data packets; and (iv) transmitting said concatenated coded data packets to one of said low-Earth orbit satellites;

an FEC decoding system located in said low-Earth orbit satellites for: (i) receiving said concatenated coded data packets; (ii) demixing said concatenated coded data packets to recover said concatenated coded header and payload codewords; (iii) decoding said concatenated coded header codewords to recover said outer encoded header codewords; (iv) outer decoding said header codewords to recover said header databits; (v) separating said concatenated coded payload codewords to recover concatenated coded payload codewords intended for the satellite receiving said concatenated coded data packets; (vi) decoding said concatenated coded payload codewords intended for the satellite receiving said concatenated coded data packets, but not other concatenated coded payload codewords, to recover outer encoded receiving satellite payload codewords; (vii) outer decoding said receiving satellite payload codewords to recover said receiving satellite payload databits; and (viii) making a hard decision on the bits of said other concatenated coded payload codewords;

an FEC coding system located in said low-Earth orbit satellites for: (i) receiving from other satellites data packets comprising header databits and concatenated coded payload codewords intended for one of said ground terminals; (ii) re-outer FEC encoding the header databits received from other satellites; (iii) re-inner FEC encoding said re-outer encoded header codewords to produce re-concatenated coded header codewords; (iv) mixing said re-concatenated coded header codewords and said concatenated coded payload codewords intended for one of said ground terminals to produce re-concatenated coded data packets; and (v) transmitting said re-concatenated coded data packets to one of said ground terminals; and an FEC decoding system located in said ground terminals for: (i) receiving said re-concatenated coded data packets; (ii) demixing said re-concatenated coded data packets to recover said re-concatenated coded header codewords and said concatenated coded payload codewords; (iii) separately inner decoding said re-concatenated coded header codewords and said concatenated coded payload codewords to recover said re-outer encoded header and outer encoded payload codewords; and (iv) separately outer decoding said header and payload codewords to recover said header and payload databits.

2. A data communication system as claimed in claim 1, wherein said FEC coding system located in said ground terminals includes:

a header outer encoder for outer FEC encoding the header databits of said data packets to produce outer encoded header codewords;

a payload outer encoder for outer FEC encoding the payload databits of said data packets to produce outer encoded payload codewords;

a header inner encoder for inner FEC encoding said outer encoded header codewords to produce said concatenated coded header codewords;

a payload inner encoder for inner FEC encoding said outer encoded payload codewords to produce said concatenated coded payload codewords; and a mixer for mixing said concatenated coded header and payload codewords to produce concatenated coded data packets.

3. A data communication system as claimed in claim 2, wherein said FEC decoding system located in said low-Earth orbit satellites includes:

a demixer for demixing said concatenated coded data packets to recover said concatenated coded header and payload codewords;

a header inner decoder for inner decoding said concatenated coded header codewords to recover said outer encoded header codewords;

a header outer decoder for outer decoding said header codewords to recover said header databits;

a separator for separating said concatenated coded payload codewords to recover concatenated coded payload codewords intended for the satellite receiving said concatenated coded data packets and other concatenated coded payload codewords;

a payload inner decoder for decoding said concatenated coded payload codewords intended for the satellite receiving said concatenated coded data packets to recover said outer encoded satellite payload codewords;

a payload outer decoder for outer decoding the outer encoded satellite payload databits; and a hard decision for forcing the bits of said other concatenated coded payload codewords to take on +1 or −1 values.

4. A data communication system as claimed in claim 3, wherein said FEC coding system located in said low-Earth orbit satellites includes:
- a header outer encoder for re-outer FEC encoding header databits received from other satellites to produce re-outer encoded header codewords;
- a header inner encoder for re-inner FEC encoding said re-outer encoded header codewords to produce said re-concatenated coded header codewords; and
- a mixer for mixing said re-concatenated coded header codewords and said concatenated coded payload codewords intended for one of said ground terminals to produce said re-concatenated coded data packets.

5. A data communication system as claimed in claim 4, wherein said FEC decoding system located in said ground terminals includes:
- a demixer for demixing said re-concatenated coded data packets to recover said re-concatenated coded header codewords and said concatenated coded payload codewords;
- a header inner decoder for decoding said re-concatenated coded header codewords to recover said re-outer encoded header codewords;
- a payload inner decoder for decoding said concatenated coded payload codewords to recover said outer encoded payload codewords;
- a header outer decoder for outer decoding the re-outer encoded header codewords to recover said header databits; and
- a payload outer decoder for outer decoding said outer encoded payload codewords to recover said payload databits.

6. A data communication system as claimed in claim 5, wherein said FEC coding system located in said low-Earth orbit satellites also includes a payload inner encoder for applying a second inner code to the concatenated coded payload codewords intended for one of said ground terminals.

7. A data communication system as claimed in claim 6, wherein said FEC decoding system located in said ground terminals also includes a further payload inner decoder for removing said second inner coder applied to said concatenated coded payload codewords by said payload inner encoder located in said low-Earth orbit satellites.

8. A data communication system as claimed in claim 5, wherein said FEC coding system located in said low-Earth orbit satellites also includes a payload bit interleaver for bit interleaving said concatenated coded payload codewords intended for one of said ground terminals and a payload inner encoder for encoding the bit interleaved concatenated coded payload codewords intended for one of said ground terminals a second time.

9. A data communication system as claimed in claim 8, wherein said payload inner decoder located in said ground terminals is a serial concatenated convolutional code (SCCC) decoder.

10. A data communication system as claimed in claim 1, wherein said low-Earth orbit satellites forward data packets from satellite to satellite via intersatellite links and wherein said low-Earth orbit satellites also include an intersatellite coding and decoding system for: (i) FEC intersatellite encoding of said recovered header databits and combining the resulting header codewords with said concatenated coded payload codewords prior to forwarding a data packet from one satellite to another satellite; (ii) decombining said resulting header codewords from said concatenated coded payload codewords of forwarded data packets and, then, FEC decoding said resulting header codewords to recover said header databits; and (iii) decoding said concatenated coded payload codewords intended for the satellite receiving said forwarded data packets, but not other concatenated coded payload codewords, to recover receiving satellite databits.

11. A data communication system as claimed in claim 10, wherein said low-Earth orbit satellites include:
- an encoder for FEC intersatellite encoding said recovered header databits and producing resulting header codewords;
- a combiner for combining said resulting header codewords with said concatenated coded payload codewords;
- a decombiner for decombining said resulting header codewords from said concatenated coded payload codewords of forwarded data packets;
- a decoder for decoding said resulting header codewords to receive said header databits;
- a separator for separating concatenated coded payload codewords intended for the satellite receiving said forwarded data packets from other concatenated coded payload codewords;
- a payload inner decoder for decoding said concatenated coded payload codewords intended for the satellite receiving said forwarded data packets to recover outer encoded receiving satellite payload codewords;
- a payload outer decoder for outer decoding said outer encoded receiving satellite payload codewords; and
- a hard decision circuit for making a hard decision on said other concatenated coded payload codewords.

12. A data communication system as claimed in claim 1, wherein:
- said FEC coding system located in said ground terminals interleaves the symbols of the header and payload codewords resulting from outer FEC encoding the header and payload databits of said data packets;
- said FEC decoding system located in said low-Earth orbit satellites:
  (i) de-interleaves the symbols of the outer encoded header codewords after the outer encoded header codewords are recovered; and
  (ii) de-interleaves the symbols of the outer encoded receiving satellite payload codewords after said outer encoded receiving satellite payload codewords are recovered;
- said FEC coding system located in said low-Earth orbit satellites interleaves the symbols of the resulting header codewords prior to re-inner FEC coding said re-outer encoded header codewords to produce re-concatenated coded header codewords; and
- said FEC decoding system located in said ground terminals de-interleaves said re-outer encoded header and outer encoded payload codewords.

13. A data communication system as claimed in claim 12, wherein said FEC coding system located in said ground terminals includes:
- a header outer encoder for outer FEC encoding the header databits of said data packets to produce outer encoded header codewords;
- a payload outer encoder for outer FEC encoding the payload databits of said data packets to produce outer encoded payload codewords;
- a header interleaver for interleaving the symbols of said outer encoded header codewords;

a payload interleaver for interleaving the symbols of said outer encoded payload codewords;

a header inner encoder for inner FEC encoding interleaved, outer encoded header codewords to produce concatenated coded, interleaved header codewords;

a payload inner encoder for inner FEC encoding interleaved, outer encoded payload codewords to produce concatenated coded, interleaved payload codewords; and a mixer for mixing said concatenated coded, interleaved header and payload codewords to produce concatenated coded, interleaved data packets.

14. A data communication system as claimed in claim 13, wherein said FEC decoding system located in said low-Earth orbit satellites includes:

a demixer for demixing said concatenated coded, interleaved data packets to recover said concatenated coded, interleaved header and payload codewords;

a header inner decoder for decoding said concatenated coded, interleaved header codewords to recover said interleaved, outer encoded header codewords;

a header de-interleaver for de-interleaving the symbols of said interleaved, outer encoded header codewords;

a header outer decoder for outer decoding said header codewords to recover said header databits;

a separator for separating said concatenated coded, interleaved payload codewords to recover concatenated coded, interleaved payload codewords intended for the satellite receiving said concatenated coded, interleaved data packets and other concatenated coded, interleaved payload codewords;

a payload inner decoder for decoding said concatenated coded, interleaved payload codewords intended for the satellite receiving said concatenated coded, interleaved data packets to recover said interleaved, outer encoded satellite payload codewords;

a payload de-interleaver for de-interleaving the symbols of said interleaved, outer encoded satellite payload codewords;

a payload outer decoder for outer decoding the outer encoded satellite payload databits; and a hard decision for forcing the other bits of said concatenated coded, interleaved payload codewords to take on +1 or −1 values.

15. A data communication system as claimed in claim 14, wherein said FEC coding system located in said low-Earth orbit satellites includes:

a header outer encoder for re-outer FEC encoding header databits received from other satellites to produce re-outer encoded header codewords;

a header interleaver for interleaving the symbols of said re-outer encoded header codewords;

a header inner encoder for re-inner FEC encoding said interleaved, re-outer encoded header codewords to produce said re-concatenated coded, interleaved header codewords; and a mixer for mixing said re-concatenated coded, interleaved header codewords and said concatenated coded, interleaved payload codewords intended for one of said ground terminals to produce said re-concatenated coded, interleaved data packets.

16. A data communication system as claimed in claim 15, wherein said FEC decoding system located in said ground terminals includes:

a demixer for demixing said re-concatenated coded, interleaved data packets to recover said re-concatenated coded, interleaved header codewords and said concatenated coded, interleaved payload codewords;

a header inner decoder for decoding said re-concatenated coded, interleaved header codewords to recover said interleaved, re-outer encoded header codewords;

a payload inner decoder for decoding said concatenated coded, interleaved payload codewords to recover said interleaved, outer encoded payload codewords;

a header de-interleaver for de-interleaving the symbols of said interleaved, re-outer encoded header codewords;

a payload de-interleaver for de-interleaving the symbols of said interleaved, outer encoded payload codewords;

a header outer decoder for outer decoding the re-outer encoded header codewords to recover said header databits; and a payload outer decoder for outer decoding said outer encoded payload codewords to recover said payload databits.

17. A data communication system as claimed in claim 16, wherein said FEC coding system located in said low-Earth orbit satellites also includes a payload inner encoder for applying a second inner code to the concatenated coded, interleaved payload codewords intended for one of said ground terminals.

18. A data communication system as claimed in claim 17, wherein said FEC decoding system located in said ground terminals also includes a further payload inner decoder for removing said second inner coder applied to said concatenated coded, interleaved payload codewords by said payload inner encoder located in said low-Earth orbit satellites.

19. A data communication system as claimed in claim 16, wherein said FEC coding system located in said low-Earth orbit satellites also includes a payload bit interleaver for bit interleaving said concatenated coded, interleaved payload codewords intended for one of said ground terminals and a payload inner encoder for encoding the bit interleaved concatenated coded, interleaved payload codewords intended for one of said ground terminals a second time.

20. A data communication system as claimed in claim 19, wherein said payload inner decoder located in said ground terminals is a serial concatenated convolutional code (SCCC) decoder.

21. A data communication system as claimed in claim 12, wherein said low-Earth orbit satellites forward data packets from satellite to satellite via intersatellite links and wherein said low-Earth orbit satellites also include an intersatellite coding and decoding system for: (i) FEC intersatellite encoding of said recovered header databits and combining the resulting header codewords with concatenated coded, interleaved payload codewords prior to forwarding a data packet from one satellite to another satellite; (ii) decombining said resulting header codewords from said concatenated coded, interleaved payload codewords of forwarded data packets and, then, FEC decoding said resulting header codewords to recover said header databits; and (iii) decoding and de-interleaving said concatenated coded, interleaved payload codewords intended for the satellite receiving said forwarded data packets, but not other concatenated coded, interleaved payload codewords, to recover receiving satellite databits.

22. A data communication system as claimed in claim 21, wherein said low-Earth orbit satellites include:

an encoder for FEC intersatellite encoding said recovered header databits and producing resulting header codewords;

a combiner for combining said resulting header codewords with said concatenated coded, interleaved payload codewords;

a decombiner for decombining said resulting header codewords from said concatenated coded, interleaved payload codewords of forwarded data packets;

a decoder for decoding said resulting header codewords to receive said header databits;

a separator for separating concatenated coded, interleaved payload codewords intended for the satellite receiving said forwarded data packets from other concatenated coded, interleaved payload codewords;

a payload inner decoder for decoding said concatenated coded, interleaved payload codewords intended for the satellite receiving said forwarded data packets to recover outer encoded, interleaved receiving satellite payload codewords;

a payload de-interleaver for de-interleaving the symbols of said recovered outer encoded, interleaved receiving satellite payload codewords;

a payload outer decoder for outer decoding said outer encoded receiving satellite payload codewords; and a hard decision circuit for making a hard decision on said other concatenated coded payload codewords.

23. A data communication system for a communication network comprising a constellation of low-Earth orbit (LEO) satellites and ground terminals for sending data packets to and receiving data packets from the low-Earth orbit satellites forming said constellation, said data packets including header databits and payload databits, said header databits including information regarding the destination of the payload databits, said data communication system comprising:

a forward error correction (FEC) coding system located in said ground terminals for: (i) separately outer FEC encoding the header and payload databits of said data packets; (ii) separately inner FEC encoding said outer encoded header and payload codewords to produce concatenated coded header and payload codewords; (iii) mixing said concatenated coded header and payload codewords to produce concatenated coded data packets; and (iv) transmitting said concatenated coded data packets to one of said low-Earth orbit satellites;

an FEC decoding system located in said low-Earth orbit satellites for: (i) receiving said concatenated coded data packets; (ii) demixing said concatenated coded data packets to recover said concatenated coded header and payload codewords; (iii) decoding said concatenated coded header codewords to recover said outer encoded header codewords; (iv) outer decoding said header codewords to recover said header databits; and (v) making a hard decision on the bits of, but not decoding, said concatenated coded payload codewords;

an FEC coding system located in said low-Earth orbit satellites for: (i) receiving from other satellites data packets comprising header databits and concatenated coded payload codewords; (ii) re-outer FEC encoding the header databits received from other satellites; (iii) re-inner FEC encoding said re-outer encoded header codewords to produce re-concatenated coded header codewords; (iv) mixing said re-concatenated coded header codewords and said concatenated coded payload codewords to produce re-concatenated coded data packets; and (v) transmitting said re-concatenated coded data packets to one of said ground terminals; and an FEC decoding system located in said ground terminals for: (i) receiving said re-concatenated coded data packets; (ii) demixing said re-concatenated coded data packets to recover said re-concatenated coded header codewords and said concatenated coded payload codewords; (iii) separately inner decoding said re-concatenated coded header codewords and said concatenated coded payload codewords to recover said re-outer encoded header and outer encoded payload codewords; and (iv) separately outer decoding said header and payload codewords to recover said header and payload databits.

24. A data communication system as claimed in claim 23, wherein said FEC coding system located in said ground terminals includes:

a header outer encoder for outer FEC encoding the header databits of said data packets to produce outer encoded header codewords;

a payload outer encoder for outer FEC encoding the payload databits of said data packets to produce outer encoded payload codewords;

a header inner encoder for inner FEC encoding said outer encoded header codewords to produce said concatenated coded header codewords;

a payload inner encoder for inner FEC encoding said outer encoded payload codewords to produce said concatenated coded payload codewords; and a mixer for mixing said concatenated coded header and payload codewords to produce concatenated coded data packets.

25. A data communication system as claimed in claim 24, wherein said FEC decoding system located in said low-Earth orbit satellites includes:

a demixer for demixing said concatenated coded data packets to recover said concatenated coded header and payload codewords;

a header inner decoder for decoding said concatenated coded header codewords to recover said outer encoded header codewords;

a header outer decoder for outer decoding said header codewords to recover said header databits; and a hard decision for forcing the bits of said concatenated coded payload codewords to take on +1 or −1 values.

26. A data communication system as claimed in claim 25, wherein said FEC coding system located in said low-Earth orbit satellites includes:

a header outer encoder for re-outer FEC encoding header databits received from other satellites to produce re-outer encoded header codewords;

a header inner encoder for re-inner FEC encoding said re-outer encoded header codewords to produce said re-concatenated coded header codewords; and a mixer for mixing said re-concatenated coded header codewords and said concatenated coded payload codewords to produce said re-concatenated coded data packets.

27. A data communication system as claimed in claim 26, wherein said FEC decoding system located in said ground terminals includes:

a demixer for demixing said re-concatenated coded data packets to recover said re-concatenated coded header codewords and said concatenated coded payload codewords;

a header inner decoder for decoding said re-concatenated coded header codewords to recover said re-outer encoded header codewords;

a payload inner decoder for decoding said concatenated coded payload codewords to recover said outer encoded payload codewords;

a header outer decoder for outer decoding the re-outer encoded header codewords to recover said header databits; and a payload outer decoder for outer decoding said outer encoded payload codewords to recover said payload databits.

28. A data communication system as claimed in claim 27, wherein said FEC coding system located in said low-Earth orbit satellites also includes a payload inner encoder for applying a second inner code to the concatenated coded payload codewords intended for one of said ground terminals.

29. A data communication system as claimed in claim 28, wherein said FEC decoding system located in said ground terminals also includes a further payload inner decoder for removing said second inner coder applied to said concatenated coded payload codewords by said payload inner encoder located in said low-Earth orbit satellites.

30. A data communication system as claimed in claim 27, wherein said FEC coding system located in said low-Earth orbit satellites also includes a payload bit interleaver for bit interleaving said concatenated coded payload codewords intended for one of said ground terminals and a payload inner encoder for encoding the bit interleaved concatenated coded payload codewords intended for one of said ground terminals a second time.

31. A data communication system as claimed in claim 30, wherein said payload inner decoder located in said ground terminals is a serial concatenated convolutional code (SCCC) decoder.

32. A data communication system as claimed in claim 23, wherein said low-Earth orbit satellites forward data packets from satellite to satellite via intersatellite links and wherein said low-Earth orbit satellites also include an intersatellite coding and decoding system for: (i) FEC intersatellite encoding of said recovered header databits and combining the resulting header codewords with said concatenated coded payload codewords prior to forwarding a data packet from one satellite to another satellite; and (ii) decombining said resulting header codewords from said concatenated coded payload codewords of forwarded data packets and, then, FEC decoding said resulting header codewords to recover said header databits.

33. A data communication system as claimed in claim 32, where said low-Earth orbit satellites include a hard decision circuit for making a hard decision on said concatenated coded payload codewords forwarded from one satellite to another satellite prior to forwarding data packets from one satellite to another satellite.

34. A data communication system as claimed in claim 23, wherein:
said FEC coding system located in said ground terminals interleaves the symbols of the header and payload codewords resulting from outer FEC encoding the header and payload databits of said data packets;
said FEC decoding system located in said low-Earth orbit satellites:
(i) de-interleaves the symbols of the outer encoded header codewords after the outer encoded header codewords are recovered; and
(ii) de-interleaves the symbols of the outer encoded receiving satellite payload codewords after said outer encoded receiving satellite payload codewords are recovered;

said FEC coding system located in said low-Earth orbit satellites interleaves the symbols of the resulting header codewords prior to re-inner FEC coding said re-outer encoded header codewords to produce re-concatenated coded header codewords; and said FEC decoding system located in said ground terminals de-interleave said re-outer encoded header and outer encoded payload codewords.

35. A data communication system as claimed in claim 34, wherein said FEC coding system located in said ground terminals includes:

a header outer encoder for outer FEC encoding the header databits of said data packets to produce outer encoded header codewords;

a payload outer encoder for outer FEC encoding the payload databits of said data packets to produce outer encoded payload codewords;

a header interleaver for interleaving the symbols of said outer encoded header codewords;

a payload interleaver for interleaving the symbols of said outer encoded payload codewords;

a header inner encoder for inner FEC encoding interleaved, outer encoded header codewords to produce concatenated coded, interleaved header codewords;

a payload inner encoder for inner FEC encoding interleaved, outer encoded payload codewords to produce said concatenated coded, interleaved payload codewords; and a mixer for mixing said concatenated coded, interleaved header and payload codewords to produce concatenated coded, interleaved data packets.

36. A data communication system as claimed in claim 35, wherein said FEC decoding system located in said low-Earth orbit satellites includes:

a demixer for demixing said concatenated coded, interleaved data packets to recover said concatenated coded, interleaved header and payload codewords;

a header inner decoder for decoding said concatenated coded, interleaved header codewords to recover said interleaved, outer encoded header codewords;

a header de-interleaver for de-interleaving the symbols of said interleaved, outer encoded header codewords;

a header outer decoder for outer decoding said header codewords to recover said header databits; and a hard decision for forcing the bits of said concatenated coded, interleaved payload codewords to take on +1 or −1 values.

37. A data communication system as claimed in claim 36, wherein said FEC coding system located in said low-Earth orbit satellites includes:

a header outer encoder for re-outer FEC encoding header databits received from other satellites to produce re-outer encoded header codewords;

a header interleaver for interleaving the symbols of said re-outer encoded header codewords;

a header inner encoder for re-inner FEC encoding said interleaved, re-outer encoded header codewords to produce said re-concatenated coded, interleaved header codewords; and a mixer for mixing said re-concatenated coded, interleaved header codewords and said concatenated coded, interleaved payload codewords to produce said re-concatenated coded, interleaved data packets.

38. A data communication system as claimed in claim 37, wherein said FEC decoding system located in said ground terminals includes:
- a demixer for demixing said re-concatenated coded, interleaved data packets to recover said re-concatenated coded, interleaved header codewords and said concatenated coded, interleaved payload codewords;
- a header inner decoder for decoding said re-concatenated coded, interleaved header codewords to recover said interleaved, re-outer encoded header codewords;
- a payload inner decoder for decoding said concatenated coded, interleaved payload codewords to recover said interleaved, outer encoded payload codewords;
- a header de-interleaver for de-interleaving the symbols of said interleaved, re-outer encoded header codewords;
- a payload de-interleaver for de-interleaving the symbols of said interleaved, outer encoded payload codewords;
- a header outer decoder for outer decoding the re-outer encoded header codewords to recover said header databits; and
- a payload outer decoder for outer decoding said outer encoded payload codewords to recover said payload databits.

39. A data communication system as claimed in claim 38, wherein said FEC coding system located in said low-Earth orbit satellites also includes a payload inner encoder for applying a second inner code to the concatenated coded, interleaved payload codewords intended for one of said ground terminals.

40. A data communication system as claimed in claim 39, wherein said FEC decoding system located in said ground terminals also includes a further payload inner decoder for removing said second inner coder applied to said concatenated coded, interleaved payload codewords by said payload inner encoder located in said low-Earth orbit satellites.

41. A data communication system as claimed in claim 38, wherein said FEC coding system located in said low-Earth orbit satellites also includes a payload bit interleaver for bit interleaving said concatenated coded, interleaved payload codewords intended for one of said ground terminals and a payload inner encoder for encoding the bit interleaved concatenated coded, interleaved payload codewords intended for one of said ground terminals a second time.

42. A data communication system as claimed in claim 41, wherein said payload inner decoder located in said ground terminals is a serial concatenated convolutional code (SCCC) decoder.

43. A data communication system as claimed in claim 34, wherein said low-Earth orbit satellites forward data packets from satellite to satellite via intersatellite links and wherein said low-Earth orbit satellites also include an intersatellite coding and decoding system for: (i) FEC intersatellite encoding of said recovered header databits and combining the resulting header codewords with said concatenated coded, interleaved payload codewords prior to forwarding a data packet from one satellite to another satellite; and (ii) decombining said resulting header codewords from said concatenated coded, interleaved payload codewords of forwarded data packets and, then, FEC decoding said resulting header codewords to recover said header databits.

44. A data communication system as claimed in claim 43, where said low-Earth orbit satellites include a hard decision circuit for making a hard decision on said concatenated coded, interleaved payload codewords forwarded from one satellite to another satellite prior to forwarding data packets from one satellite to another satellite.

45. A data communication method for a communication network comprising a constellation of low-Earth orbit (LEO) satellites and a plurality of ground stations for transmitting data packets to and receiving data packets from said low-Earth orbit satellites forming said constellation, said data packets including header databits and payload databits, said header databits including information regarding the destination of the payload databits, said method comprising:
- forward error correction (FEC) coding data packets to be transmitted by said ground terminals to one of said LEO satellites prior to transmission by: (i) separately outer FEC encoding the header and payload databits of said data packets; (ii) separately inner FEC encoding said outer encoded header and payload codewords to produce concatenated coded header and payload codewords; and (iii) mixing said concatenated coded header and payload codewords to produce concatenated coded data packets;
- transmitting said concatenated coded data packets to one of said LEO satellites;
- receiving said concatenated coded data packets at one of said LEO satellites;
- FEC decoding said concatenated coded data packets at said one of said LEO satellites by: (i) demixing said concatenated coded data packets to recover said concatenated coded header and payload codewords; (ii) inner decoding said concatenated coded header codewords to recover said outer encoded header codewords, (iii) outer decoding said header codewords to recover said header databits; (iv) separating said concatenate d coded payload data packets to recover concatenated coded payload codewords intended for the satellite receiving said concatenated coded data packets; (v) inner decoding said concatenated coded payload codewords intended for the satellite receiving said concatenated coded data packets, but not other concatenated coded payload codewords, to recover outer encoded receiving satellite payload codewords; (vi) outer decoding said receiving satellite payload codewords to recover said receiving satellite payload databits; and (vii) making a hard decision on the bits of said other coded payload codewords; and
- conveying said header databits and said other concatenated coded payload codewords through said constellation of LEO satellites to another of said LEO satellites.

46. A data communication method as claimed in claim 45, wherein said method includes:
- FEC coding said header databits at said other satellite by: (i) re-outer FEC encoding the header databits; (ii) re-inner FEC encoding said re-outer encoded header codewords to produce re-concatenated coded header codewords; and (iii) mixing said re-concatenated coded header codewords and said concatenated coded payload codewords intended for one of said ground terminals to produce re-concatenated coded data packets;
- transmitting said re-concatenated coded data packets to a ground terminal;
- receiving said re-concatenated coded data packets at a ground terminal; and
- FEC decoding said re-concatenated coded data packets at said ground terminal by: (i) demixing said re-concatenated coded data packets to recover said re-concatenated coded header codewords and concatenated coded payload codewords; (ii) inner decoding said re-concatenated coded header codewords and said concatenated coded payload codewords to recover said re-outer encoded header and outer encoded payload codewords; (iii) outer decoding said header and payload codewords to recover said header and payload databits.

47. A data communication method as claimed in claim 46, wherein said method includes second inner encoding said concatenated coded payload codewords intended for one of said ground terminals at said other satellite prior to mixing said re-concatenated coded header codewords with said double inner concatenated coded payload codewords.

48. A data communication method as claimed in claim 47, wherein said double inner concatenated coded payload codewords are inner decoded twice at said ground terminal prior to outer decoding said concatenated coded payload codewords.

49. A data communication method as claimed in claim 46, wherein said method includes bit interleaving and second inner encoding said concatenated coded payload codewords intended for one of said ground terminals at said other satellite prior to mixing the re-concatenated coded header codewords with said bit interleaved double inner concatenated coded payload codewords.

50. A data communication method as claimed in claim 49, wherein said inner decoding of said bit interleaved double inner concatenated coded payload data packets at said ground terminal is accomplished by a serial concatenated convolutional code (SCCC) decoder.

51. A data communication method as claimed in claim 46, wherein said low-Earth orbit satellites forward data packets from satellite to satellite and wherein said method includes: (i) intersatellite FEC encoding said recovered header databits and combining the resulting header codewords with said concatenated coded payload codewords prior to forwarding a data packet from one satellite to another satellite; (ii) decombining said resulting header codewords from said concatenated coded payload codewords of forwarded data packets and, then, decoding said resulting header codewords to recover said header databits; and (iii) decoding said concatenated coded payload codewords intended for the satellite receiving said forwarded data packets, but not other concatenated coded payload codewords to recover receiving satellite databits.

52. A data communication method as claimed in claim 51, wherein said method includes:
FEC intersatellite encoding said recovered header databits to produce resulting header codewords;
combining said resulting header codewords with said concatenated coded payload codewords;
decombining said resulting header codewords from said concatenated coded payload codewords of forwarded data packets;
decoding said resulting header codewords to recover said header databits;
separating said concatenated coded payload codewords intended for the satellite receiving said forwarded data packets from other concatenated coded payload codewords;
inner decoding said concatenated coded payload codewords intended for the satellite receiving said forwarded data packets to recover outer encoded receiving satellite payload codewords;
outer decoding said outer encoded receiving satellite payload codewords; and
making an intersatellite hard decision on said other concatenated coded payload codewords.

53. A data communications method as claimed in claim 46, wherein:
the symbols of said header and payload codewords resulting from said outer encoding of said header and payload databits of said data packets are interleaved;
the symbols of the outer encoded header codewords are de-interleaved after the outer encoded header codewords are recovered and the symbols of the outer encoded receiving satellite payload codewords are de-interleaved after the outer encoded receiving satellite payload codewords are recovered;
the symbols of the resulting header codewords are interleaved prior to re-inner FEC coding said re-outer encoded header codewords to produce re-concatenated coded header codewords; and
the symbols of the re-outer encoded header and outer encoded payload codewords are de-interleaved after the re-outer encoded header and outer encoded payload codewords are recovered.

54. A data communication method as claimed in claim 53, wherein said method includes second inner encoding concatenated coded, interleaved payload codewords intended for one of said ground terminals at said other satellite prior to mixing re-concatenated coded, interleaved header codewords with the resulting double inner concatenated coded, interleaved payload codewords.

55. A data communication method as claimed in claim 54, wherein said double inner concatenated coded, interleaved payload codewords are inner decoded twice at said ground terminal prior to de-interleaving and outer decoding said concatenated coded, interleaved payload codewords.

56. A data communication method as claimed in claim 53, wherein said method includes bit interleaving and second inner encoding said concatenated coded, interleaved payload codewords intended for one of said ground terminals at said other satellite prior to mixing the re-concatenated coded, interleaved header codewords with the resulting bit interleaved double inner concatenated coded, interleaved payload codewords.

57. A data communication method as claimed in claim 56, wherein said inner decoding of said bit interleaved double inner concatenated coded, interleaved payload data packets at said ground terminal is accomplished by a serial concatenated convolutional code (SCCC) decoder.

58. A data communication method as claimed in claim 53, wherein said low-Earth orbit satellites forward data packets from satellite to satellite and wherein said method includes: (i) intersatellite FEC encoding said recovered header databits and combining the resulting header codewords with concatenated coded, interleaved payload codewords prior to forwarding a data packet from one satellite to another satellite; (ii) decombining said resulting header codewords from said concatenated coded, interleaved payload codewords of forwarded data packets and, then, decoding said resulting header codewords to recover said header databits; and (iii) decoding and de-interleaving said concatenated coded, interleaved payload codewords intended for the satellite receiving said forwarded data packets, but not other concatenated coded, interleaved payload codewords, to recover receiving satellite databits.

59. A data communication method as claimed in claim 58, wherein said method includes:
FEC intersatellite encoding said recovered header databits to produce resulting header codewords;
combining said resulting header codewords with said concatenated coded, interleaved payload codewords;

decombining said resulting header codewords from said concatenated coded, interleaved payload codewords of forwarded data packets;

decoding said resulting header codewords to recover said header databits;

separating said concatenated coded, interleaved payload codewords intended for the satellite receiving said forwarded data packets from other concatenated coded, interleaved payload codewords;

inner decoding said concatenated coded, interleaved payload codewords intended for the satellite receiving said forwarded data packets to recover outer encoded, interleaved receiving satellite payload codewords;

de-interleaving said outer encoded, interleaved receiving satellite payload codewords to recover outer encoded receiving satellite payload codewords;

outer decoding said outer encoded receiving satellite payload codewords; and making an intersatellite hard decision on said other concatenated coded, interleaved payload codewords.

60. A data communication method for a communication network comprising a constellation of low-Earth orbit (LEO) satellites and a plurality of ground stations for transmitting data packets to and receiving data packets from said low-Earth orbit satellites forming said constellation, said data packets including header databits and payload databits, said header databits including information regarding the destination of the payload databits, said method comprising:

forward error correction (FEC) coding data packets to be transmitted by said ground terminals to one of said LEO satellites prior to transmission by: (i) separately outer FEC encoding the header and payload databits of said data packets; (ii) separately inner FEC encoding said outer encoded header and payload codewords to produce concatenated coded header and payload codewords; and (iii) mixing said concatenated coded header and payload codewords to produce concatenated coded data packets;

transmitting said concatenated coded data packets to one of said LEO satellites;

receiving said concatenated coded data packets at one of said LEO satellites;

FEC decoding said concatenated coded data packets at said one of said LEO satellites by: (i) demixing said concatenated coded data packets to recover said concatenated coded header and payload codewords; (ii) inner decoding said concatenated coded header codewords to recover said outer encoded header codewords; (iii) outer decoding said header codewords to recover said header databits; and (iv) making a hard decision on the bits of, but not decoding, said concatenated coded payload codewords; and conveying said header databits and said concatenated coded payload codewords through said constellation of LEO satellites to another of said LEO satellites.

61. A data communication method as claimed in claim 60, wherein said method includes:

FEC coding said header databits at said other satellite by: (i) re-outer FEC encoding the header databits; (ii) re-inner FEC encoding said re-outer encoded header codewords to produce re-concatenated coded header codewords; and (iv) mixing said re-concatenated coded header codewords in said concatenated coded payload codewords to produce re-concatenated coded data packets;

transmitting said re-concatenated coded data packets to a ground terminal;

receiving said re-concatenated coded data packets at a ground terminal; and

FEC decoding said re-concatenated coded data packets at said ground terminal by: (i) demixing said re-concatenated coded data packets to recover said re-concatenated coded header codewords and concatenated coded payload codewords; (ii) inner decoding said re-concatenated coded header codewords and concatenated coded payload codewords to recover said re-outer encoded header and outer encoded payload codewords; and (iii) outer decoding said header and payload codewords to recover said header and payload databits.

62. A data communication method as claimed in claim 61, wherein said method includes second inner encoding said concatenated coded payload codewords intended for one of said ground terminals at said other satellite prior to mixing said re-concatenated coded header codewords with the resulting double inner concatenated coded payload codewords.

63. A data communication method as claimed in claim 62, wherein said double inner concatenated coded payload codewords are inner decoded twice at said ground terminal prior to outer decoding said concatenated coded payload codewords.

64. A data communication method as claimed in claim 61, wherein said method includes bit interleaving and second inner encoding said concatenated coded payload codewords intended for one of said ground terminals at said other satellite prior to mixing the re-concatenated coded header codewords with the resulting bit interleaved double inner concatenated coded payload codewords.

65. A data communication method as claimed in claim 64, wherein said inner decoding of said bit interleaved double inner concatenated coded payload data packets at said ground terminal is accomplished by a serial concatenated convolutional code (SCCC) decoder.

66. A data communication method as claimed in claim 61, wherein said low-Earth orbit satellites forward data packets from satellite to satellite and wherein said method includes: (i) intersatellite FEC encoding said recovered header databits and combining the resulting header codewords with said concatenated coded payload codewords prior to forwarding data packets from one satellite to another satellite; and (ii) decombining said resulting header codewords from said concatenated coded payload codewords of forwarded data packets and, then, decoding said resulting header codewords to recover said header databits.

67. A data communication method as claimed in claim 66, wherein said method includes making an intersatellite hard decision on said concatenated coded payload codewords forwarded from one satellite to another satellite prior to forwarding data packets from one satellite to another satellite.

68. A data communications method as claimed in claim 61, wherein:

the symbols of said header and payload codewords resulting from said outer encoding of said header and payload databits of said data packets are interleaved;

the symbols of the outer encoded header codewords are de-interleaved after the outer encoded header codewords are recovered and the symbols of the outer encoded receiving satellite payload codewords are de-interleaved after the outer encoded receiving satellite payload codewords are recovered;

the symbols of the resulting header codewords are interleaved prior to re-inner FEC coding said re-outer encoded header codewords to produce re-concatenated coded header codewords; and the symbols of the re-outer encoded header and outer encoded payload codewords are de-interleaved after the re-outer encoded header and outer encoded payload codewords are recovered.

69. A data communication method as claimed in claim 68, wherein said method includes second inner encoding said concatenated coded, interleaved payload codewords intended for one of said ground terminals at said other satellite prior to mixing said re-concatenated coded, interleaved header codewords with the resulting double inner concatenated coded, interleaved payload codewords.

70. A data communication method as claimed in claim 69, wherein said double inner concatenated coded, interleaved payload codewords are inner decoded twice at said ground terminal prior to de-interleaving and outer decoding said concatenated coded, interleaved payload codewords.

71. A data communication method as claimed in claim 68, wherein said method includes bit interleaving and second inner encoding said concatenated coded, interleaved payload codewords intended for one of said ground terminals at said other satellite prior to mixing the re-concatenated coded, interleaved header codewords with the resulting bit interleaved double inner concatenated coded, interleaved payload codewords.

72. A data communication method as claimed in claim 71, wherein said inner decoding of said bit interleaved double inner concatenated coded, interleaved payload data packets at said ground terminal is accomplished by a serial concatenated convolutional code (SCCC) decoder.

73. A data communication method as claimed in claim 68, wherein said low-Earth orbit satellites forward data packets from satellite to satellite and wherein said method includes: (i) intersatellite FEC encoding said recovered header datbits and combining the resulting header codewords with said concatenated coded, interleaved payload codewords prior to forwarding a data packet from one satellite to another satellite; and (ii) decombining said resulting header codewords from said concatenated coded, interleaved payload codewords of forwarded data packets and, then, decoding said resulting header codewords to recover said header databits.

74. A data communication method as claimed in claim 73, wherein said method includes making an intersatellite hard decision on said concatenated coded, interleaved payload codewords forwarded from one satellite to another satellite prior to forwarding data packets from one satellite to another satellite.

* * * * *